United States Patent
Imamura et al.

(10) Patent No.: US 6,846,765 B2
(45) Date of Patent: Jan. 25, 2005

(54) SILICON NITRIDE POWDER, SILICON NITRIDE SINTERED BODY, SINTERED SILICON NITRIDE SUBSTRATE, AND CIRCUIT BOARD AND THERMOELECTRIC MODULE COMPRISING SUCH SINTERED SILICON NITRIDE SUBSTRATE

(75) Inventors: Hisayuki Imamura, Saitama-ken (JP); Shigeyuki Hamayoshi, Fukuoka-ken (JP); Tsunehiro Kawata, Saitama-ken (JP); Masahisa Sobue, Saitama-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/956,033

(22) Filed: Sep. 20, 2001

(65) Prior Publication Data

US 2002/0164475 A1 Nov. 7, 2002

(30) Foreign Application Priority Data

Sep. 20, 2000 (JP) ......................................... 2000-284957
Oct. 26, 2000 (JP) ......................................... 2000-326489

(51) Int. Cl.⁷ .......................................... C04B 35/587
(52) U.S. Cl. ..................................... 501/97.2; 507/97.3
(58) Field of Search ................................. 501/97.2, 97.3

(56) References Cited

U.S. PATENT DOCUMENTS

| | | | | |
|---|---|---|---|---|
| 4,608,354 A | * | 8/1986 | Avella et al. .............. | 501/97.2 |
| 5,098,872 A | * | 3/1992 | Suyama et al. ............ | 501/97.2 |
| 5,672,553 A | * | 9/1997 | Mitomo et al. ............ | 501/97.2 |
| 5,908,797 A | * | 6/1999 | Urashima et al. .......... | 501/97.3 |
| 6,242,374 B1 | * | 6/2001 | Komatsu .................... | 501/97.2 |
| 6,294,244 B1 | * | 9/2001 | Iwaida et al. .............. | 501/97.3 |
| 6,313,054 B1 | * | 11/2001 | Matsubara ................. | 501/97.1 |
| 6,391,812 B1 | * | 5/2002 | Araki et al. ................ | 501/97.3 |

FOREIGN PATENT DOCUMENTS

| | | | |
|---|---|---|---|
| JP | 1-160870 | * | 6/1989 |
| JP | 04-175268 | | 6/1992 |
| JP | 06-216481 | | 8/1994 |
| JP | 06-263410 | | 9/1994 |
| JP | 08-319187 | | 12/1996 |
| JP | 09-030866 | | 2/1997 |
| JP | 10-065296 | | 3/1998 |
| JP | 10-194842 | | 7/1998 |
| JP | 11-349381 | | 12/1999 |
| JP | 2000-344577 | * | 12/2000 |

OTHER PUBLICATIONS

Naoto Hirosaki, et al.; Precipitation of Second Phase in $Si_3N_4$ of Self–reinforced Silicon Nitride; The abstract papers presented at the Annual Meeting of The Ceramic Society of Japan, 1998; held on Mar. 29–31, 1998; at Tsudanuma Campus (Narashino City), Chiba Institute of Technology; published by the Ceramic Society of Japan; pp. 196–197.

Kiyoshi Hirao, et al; Preparation of Rod–like $\beta$–$Si_3N_4$ Single Crystal Partcles; Journal of the Ceramic Society of Japan 101[9] 11078–1080 (1993).

* cited by examiner

*Primary Examiner*—Karl Group

(57) ABSTRACT

A silicon nitride sintered body comprising Mg and at least one rare earth element selected from the group consisting of La, Y, Gd and Yb, the total oxide-converted content of the above elements being 0.6–7 weight %, with Mg converted to MgO and rare earth elements converted to rare earth oxides $RE_xO_y$. The silicon nitride sintered body is produced by mixing 1–50 parts by weight of a first silicon nitride powder having a particle ratio of 30–100%, an oxygen content of 0.5 weight % or less, an average particle size of 0.2–10 $\mu$m, and an aspect ratio of 10 or less, with 99–50 parts by weight of $\alpha$-silicon nitride powder having an average particle size of 0.2–4 $\mu$m; and sintering the resultant mixture at a temperature of 1,800° C. or higher and pressure of 5 atm or more in a nitrogen atmosphere.

7 Claims, 8 Drawing Sheets

7.5 μm

SILICON NITRIDE POWDER, SILICON NITRIDE SINTERED BODY, SINTERED SILICON NITRIDE SUBSTRATE, AND CIRCUIT BOARD AND THERMOELECTRIC MODULE COMPRISING SUCH SINTERED SILICON NITRIDE SUBSTRATE

FIELD OF THE INVENTION

The present invention relates to a high-strength, high-thermal conductivity, silicon nitride sintered body suitable for semiconductor substrates and electronics parts for heat sinks for power modules, heat-generating components, and structural members for general machines, members for molten metals or members for thermal engines, etc., to a method for producing such a silicon nitride sintered body, to silicon nitride powder used for the production of such a silicon nitride sintered body and a method for producing it, and further to a circuit board and a thermoelectric element module respectively comprising a sintered silicon nitride substrate.

PRIOR ART

Because a silicon nitride sintered body is excellent in mechanical properties such as high-temperature strength properties and wear resistance, etc., heat resistance, low thermal expansion, thermal shock resistance and corrosion resistance to molten metals, it has conventionally been used for various structural applications such as gas turbines, engine components, steel-producing machines, and members immersed in molten metals, etc. Because of good electric insulation, it also is used as electrically insulating materials.

According to recent development of semiconductor chips generating a lot of heat such as high-frequency transistors, power ICs, etc., there is increasing demand to ceramic substrates having good heat dissipation properties (high thermal conductivity) in addition to electric insulation. Though aluminum nitride substrates have already been used as such ceramic substrates, the aluminum nitride substrates lack mechanical strength, fracture toughness, etc., resulting in the likelihood that substrate units are cracked by fastening at an assembling step. Also, because a circuit board comprising silicon semiconductor chips mounted onto an aluminum nitride substrate is likely to be cracked by thermal cycles because of large difference in a thermal expansion coefficient between silicon chips and an aluminum nitride substrate, the aluminum nitride substrate is cracked by thermal cycles, resulting in decrease in mounting reliability.

Under such circumstances, much attention was paid to a high-thermal conductivity, silicon nitride sintered body having excellent mechanical strength, fracture toughness and thermal fatigue resistance, though it is poorer in thermal conductivity than aluminum nitride, and various proposals were made.

For instance, Japanese Patent Laid-Open No. 4-175268 discloses a silicon nitride sintered body substantially comprising silicon nitride and having a density of 3.15 g/cm$^3$ or more and a thermal conductivity of 40 W/mK or more, the amounts of aluminum and oxygen contained as impurities being 3.5 weight % or less each. Though this silicon nitride sintered body has thermal conductivity of 40 W/mK or more, high-strength silicon nitride sintered body with higher thermal conductivity has been desired.

Japanese Patent Laid-Open No. 9-30866 discloses a silicon nitride sintered body comprising 85–99 weight % of β-silicon nitride grains, the balance being grain boundaries of oxides or oxinitrides, the grain boundaries comprising 0.5–10 weight % of at least one element selected from the group consisting of Mg, Ca, Sr, Ba, Y, La, Ce, Pr, Nd, Sm, Gd, Dy, Ho, Er and Yb, the Al content in the grain boundaries being 1 weight % or less, the porosity of the sintered body being 5% or less, and a percentage of those having short radius of 5 μm or more in the β-silicon nitride grains being 10–60 volume %.

Japanese Patent Laid-Open No. 10-194842 discloses a silicon nitride sintered body having anisotropic thermal conductivity and thus increased thermal conductivity in a particular direction, by adding columnar particles or whisker of silicon nitride to starting material powder in advance, forming a green body composed of these particles or whisker two-dimensionally oriented by a doctor blade method or an extrusion method, and sintering the green body.

However, to develop elongated crystal grains in a sintered body in the methods disclosed in Japanese Patent Laid-Open Nos. 9-30866 and 10-194842, it is indispensable that seed crystals or whisker for forming growth nuclei is added in advance, and that sintering is carried out at 2,000° C. or higher and 10.1 MPa (100 atm) or more in a nitrogen atmosphere. Therefore, special high-temperature, high-pressure apparatuses such as hot pressing or HIP, etc. are needed, resulting in increase in the costs of the sintered bodies. Also, because they need a complicated molding process for producing green bodies with oriented silicon nitride grains, the productivity is inevitably extremely low.

J. Ceram. Soc. Japan, 101[9] 1078–80 (1993) discloses a method for producing β-silicon nitride powder for providing silicon nitride with a microstructure having good thermal conductivity or well-balanced bending strength and fracture toughness, the method comprising mixing starting silicon nitride powder with predetermined amounts of $Y_2O_3$ and $SiO_2$, and heat-treating the resultant mixture in a non-oxidizing atmosphere such as nitrogen, etc. However, because this method uses large amounts of $Y_2O_3$ and $SiO_2$ as a slug, the resultant treated powder is so aggregated that it should be crushed in a grinding machine, etc. Also, because it is necessary to carry out an acid treatment for removing oxides from the surfaces of silicon nitride grains and a classification treatment for controlling a particle size, the processes are complicated. In addition, the above oxides are dissolved in the resultant silicon nitride powder.

Japanese Patent Laid-Open No. 6-263410 discloses a method for industrially producing silicon nitride powder having a β-particle ratio increased to 95% or more at a low cost, by heat-treating a starting silicon nitride powder having an oxygen content of 2–5 weight % as converted to $SiO_2$ and a specific surface area of 1 m$^2$/g or more at a temperature of 1,500° C. or higher in a non-oxidizing atmosphere. This reference describes that when the oxygen content as converted to $SiO_2$ is less than 2 weight % in the starting silicon nitride powder, the β-particle ratio of the silicon nitride powder is insufficient and likely to be ununiform, and that when the oxygen content exceeds 5 weight % as converted to $SiO_2$, $SiO_2$ remains in the heat-treated silicon nitride powder, resulting in poor properties. It also describes that the starting silicon nitride powder is preferably fine powder having a specific surface area of 1 m$^2$/g or more, to carry out the heat treatment uniformly for a short period of time.

However, because the starting silicon nitride powder containing 2–5 weight %, as converted to $SiO_2$, of oxygen is used to complete the treatment at low temperatures for a short period of time in EXAMPLES of Japanese Patent Laid-Open No. 6-263410, the resultant silicon nitride powder has an oxygen content of 1.2 weight % or more. Also, this method is disadvantageous in that $SiO_2$ powder is added in advance to control the oxygen content of the starting material powder, and that the heat treatment should be carried out in an oxygen atmosphere. It is further disadvantageous in that because the resultant silicon nitride powder is aggregated by the heat treatment, the silicon nitride powder should be crushed by a ball mill, a roll crusher, etc.

The Summary of Lectures 2B04 in 1998 Annual Meeting of The Japan Ceramics Association discloses the production of a silicon nitride sintered body having as high a thermal conductivity as 100 W/mK or more, by sintering a green body of silicon nitride powder at 2,000° C. and 10 atm in a nitrogen gas and then heat-treating it in a high-temperature, high-pressure nitrogen gas of 2,200° C. and 300 atm. This reference describes that high thermal conductivity is achieved by the growth of silicon nitride grains in the sintered body and the precipitation of a hexagonal pillar phase in the silicon nitride grains by a high-temperature heat treatment. Specifically, a sintering aid composed of Y—Nd—Si—O is dissolved in the silicon nitride grains at the time of sintering and grain growth, and an amorphous phase having a composition of Y—Nd—Si—O is precipitated in the silicon nitride grains at the time of heat treatment at a high temperature and cooling, part of the precipitates being crystallized, thereby increasing the purity of the silicon nitride grains.

However, a high-temperature, high-pressure apparatus is needed to obtain the above high-thermal conductivity, silicon nitride sintered body, resulting in increase in its production cost. Further, because heat treatment is carried out after sintering, the productivity is extremely low. In addition, detailed composition analysis and observation are not conducted on the precipitation phase in the silicon nitride grains in the above sintered body, failing to make clear correlations with improvement in thermal conductivity.

With respect to circuit boards comprising the above silicon nitride substrates and copper circuit plates formed thereon, and circuit boards comprising aluminum circuit plates formed on the silicon nitride substrates for improved thermal cycle resistance, various proposals were made.

For instance, with respect to a copper circuit board, Japanese Patent Laid-Open No. 6-216481 discloses a ceramic-copper circuit board formed by integrally bonding a copper circuit plate to a surface of a silicon nitride substrate having a thermal conductivity of 60–180 W/mK via a bonding metal layer containing an active metal. In this circuit board, bonding strength between the copper circuit plate and the silicon nitride substrate is improved by using a brazing material having a composition comprising 15–35 weight % of Cu, and 1–10 weight % of at least one active metal selected from the group consisting of Ti, Zr, Hf and Nb, the balance being substantially Ag.

Japanese Patent Laid-Open No. 8-319187 discloses a so-called DBC (Direct-Bonded Copper) circuit board obtained by disposing a copper circuit plate having a copper oxide layer formed by an oxidation treatment in a temperature range of 150–360° C. in the atmosphere on a surface of a silicon nitride substrate at a predetermined position, heating it at a temperature of lower than the melting point (1,083° C.) of copper and of a eutectic temperature (1,065° C.) of copper—copper oxide or higher, and bonding the copper circuit plate directly to the silicon nitride substrate with the resultant liquid eutectic Cu—O compound phase as a bonding material. Because the copper plate is directly bonded to the silicon nitride substrate in this circuit board, there is no material such as a bonding material and a brazing material existing between the metal circuit plate and the silicon nitride substrate. Therefore, thermal resistance is so low between them that heat generated by semiconductor chips mounted onto the metal circuit plate can quickly be dissipated outside.

With respect to an aluminum circuit board, Japanese Patent Laid-Open No. 10-65296 discloses a circuit board comprising an $Si_3N_4$ ceramic substrate, and aluminum plates bonded to both surfaces of the ceramic substrate via an Al—Si brazing material. When this circuit board is subjected to thermal cycles, only small thermal stress is applied to the ceramic substrate, so that the ceramic substrate is free from cracking.

However, the above references concerning the circuit board fail to investigate a surface condition of the silicon nitride substrate dominating the bonding of a circuit plate of copper or aluminum to the silicon nitride substrate. In any of the above bonding methods, without adjusting the surface condition or texture of the silicon nitride substrate, there is large unevenness in the bonding strength of the metal circuit plate to the silicon nitride substrate and the thermal cycle resistance of the resultant circuit board, failing to provide a high-reliability circuit board.

FIG. 13 shows one example of the thermoelectric module comprising the above ceramic substrate as an electrically insulating substrate. The thermoelectric module 60 comprises p-type, thermoelectric semiconductor elements 61 and n-type, thermoelectric semiconductor elements 62, both elements 61, 62 being series-connected in the pattern of pnpn . . . to electrodes 71 bonded to the electrically insulating substrate 70. When DC voltage is applied to terminals 72 so that the thermoelectric semiconductor elements 61, 62 are energized via lead wires 73 and electrodes 71, heat is generated on a side where electric current flows from the p-type thermoelectric semiconductor element 61 to the n-type thermoelectric semiconductor element 62, while heat is absorbed on a side where electric current flows from the n-type thermoelectric semiconductor element 62 to the p-type thermoelectric semiconductor element 61. This phenomenon is called "Peltier effect." Because of this Peltier effect, the electrically insulating substrate 70 bonded to the heat-generating side is heated, while the electrically insulating substrate 70 bonded to the heat-absorbing side is cooled. In the thermoelectric module, the heat-generating side and the heat-absorbing side are exchanged by changing the polarity of the DC current supplied to the terminals 72. Also, in the thermoelectric module, voltage is generated at the terminals 72 by changing the temperatures of two electrically insulating substrates 70. This phenomenon is called "Seebeck effect."

The use of a silicon nitride substrate as an electrically insulating substrate 70 is known. For instance, Japanese Patent Laid-Open No. 11-349381 discloses the use of silicon nitride sintered body having a thermal conductivity of 40 W/mK or more for a thermal conduction plate for Peltier elements, that is, for an electrically insulating substrate 70 of the to thermoelectric module. However, Japanese Patent Laid-Open No 11-349381 fails to describe technologies necessary for enhancing the reliability of the thermoelectric module and thus stabilizing its operation. When voltage is applied to the terminals of a thermoelectric module comprising an insulating silicon nitride substrate, peeling has undesirably occurred at bonding interfaces between the insulating silicon nitride substrate and the electrodes.

As a result of investigating the causes of peeling at bonding interfaces, it has been found that thermal stress is a culprit. That is, when DC voltage is applied to the terminals of the thermoelectric module, the insulating silicon nitride substrate 70 on the side of heat generation expands by temperature elevation, while the insulating silicon nitride substrate 70 on the side of heat absorption shrinks by temperature decrease. It has thus been found that thermal stress is generated at bonding interfaces between the insulating silicon nitride substrate 70 and the electrodes 71, which causes cracking at bonding interfaces.

OBJECT OF THE INVENTION

Accordingly, an object of the present invention is to provide a high-thermal conductivity, silicon nitride sintered body excellent in mechanical strength and free from anisotropic thermal conductivity, without costly high-temperature, high-pressure, anisotropic sintering.

Another object of the present invention is to provide a silicon nitride sintered body having high thermal conductivity and mechanical strength by limiting the β-particle ratio and contents of oxygen and impurities of a first silicon nitride powder, and a mixing ratio of the first silicon nitride powder with α-silicon nitride powder, etc., and a method for producing such a silicon nitride sintered body.

A further object of the present invention is to provide silicon nitride powder for producing a silicon nitride sintered body having high strength and thermal conductivity, and a method for producing such silicon nitride powder.

A still further object of the present invention is to provide a silicon nitride substrate having a surface condition or texture excellent in bonding strength and thermal cycle resistance and suitable for producing circuit boards and thermoelectric conversion modules.

A still further object of the present invention is to provide a heat-dissipation circuit board comprising the above high-strength, high-thermal conductivity, silicon nitride sintered body.

A still further object of the present invention is to provide a high-reliability thermoelectric module free from peeling in bonded interfaces between an insulating silicon nitride substrate and electrodes.

SUMMARY OF THE INVENTION

As a result of intense research in view of the above objects, the inventors have found; (a) by limiting the β-particle ratio, contents of oxygen and impurities in silicon nitride powder used and its mixing ratio with α-powder, etc., a silicon nitride sintered body having a thermal conductivity of 100 W/mK or more and sufficient bending strength can stably be obtained, and (b) to obtain a silicon nitride sintered body having high thermal conductivity and strength, MgO for improving sinterability and at least one rare earth element (RE) selected from the group consisting of La, Y, Gd and Yb are effectively added in particular amounts as sintering aids. The present invention is based on these findings.

Thus, the silicon nitride powder according to the present invention has a β-particle ratio of 30–100%, an oxygen content of 0.5 weight % or less, an average particle size of 0.2–10 μm, and an aspect ratio of 10 or less. In the silicon nitride powder, the contents of Fe and Al are preferably 100 ppm or less each.

The method for producing silicon nitride powder according to the present invention comprises the step of heat-treating starting silicon nitride powder comprising 0.02–1.0 weight %, as converted to $SiO_2$, of oxygen and having a specific surface area of 0.5 $m^2$/g or more at a temperature of 1,800° C. or higher in a non-oxidizing atmosphere of nitrogen or nitrogen and hydrogen. 80 weight % or more of the heat-treated powder preferably passes through a 1-mm-opening sieve.

In a predetermined embodiment, the silicon nitride powder can be produced by a starting silicon nitride powder obtained by a metal silicon direct-nitriding method, a silica reduction method or a silicon imide decomposition method, at 1,400–1,950° C. for 5–20 hours in an atmosphere of nitrogen or nitrogen and hydrogen. To achieve a high β-particle ratio and a low oxygen content, the heat treatment conditions are preferably 1800° C.–1,950° C.×1–20 hours, particularly 5–20 hours. In the heat treatment at 1,800° C. or higher, it is preferably carried out in an atmosphere of nitrogen or nitrogen and hydrogen at 0.5 MPa (5 atm) or more to avoid the decomposition of silicon nitride.

To reduce the oxygen content after heat treatment to 0.5 weight % or less, particularly 0.2–0.5 weight %, the oxygen content of the starting silicon nitride powder is 1.0 weight % or less as converted to $SiO_2$. To make the amounts of impurities such as Fe, Al, etc. as small as possible, it is preferable to use a high-purity silicon nitride powder formed by an imide decomposition method as a starting material. A crucible into which the starting material powder is charged may be made of carbon or BN. When a to heat treatment furnace comprising a carbon heater and a carbon heat insulator is used, a BN crucible is preferable to avoid an excessive CO reducing atmosphere.

Because the silicon nitride powder of the present invention is produced from a starting material powder having a small oxygen content, it has a small content of $SiO_2$ serving as a sintering aid. Further, because a phase transformation from α-silicon nitride powder to β-silicon nitride powder is caused by a so-called gas phase reaction in which oxygen absorbed to or dissolved in the silicon nitride powder evaporates during the heat treatment process, the heat-treated silicon nitride powder has a low oxygen content and is free from aggregation, requiring neither pulverization nor acid treatment step for removing surface oxides. In addition, because oxides such as $Y_2O_3$, etc. are not used as sintering aids for grain growth, dissolving of these sintering aids in the silicon nitride powder can be avoided.

The high-strength, high-thermal conductivity, silicon nitride sintered body of the present invention comprises Mg and at least one rare earth element selected from the group consisting of La, Y, Gd and Yb, the total oxide-converted content of the above elements being 0.6–7 weight %, with Mg converted to MgO and rare earth elements converted to rare earth oxides $RE_xO_y$.

When the total oxide-converted content is less than 0.6 weight %, sufficient density cannot be obtained by sintering, resulting in as low a relative density as less than 95%. On the other hand, when it exceeds 7 weight %, the silicon nitride sintered body contains an excess amount of grain boundaries with low thermal conductivity, whereby the resultant sintered body has a thermal conductivity of less than 100 W/mK. The total oxide-converted content is preferably 0.6–4 weight %.

The silicon nitride sintered body of the present invention has a thermal conductivity of 100 W/mK or more and a three-point bending strength of 600 MPa or more at room temperature. The thermal conductivity at room temperature is preferably 100–300 W/mK, and the three-point bending strength at room temperature is preferably 600–1,500 MPa.

In a transmission electron micrograph having a magnitude of 10,000 times or more, nano-size, fine particles having an average particle size of 100 nm or less are observed in silicon nitride grains in the silicon nitride sintered body of the present invention. The nano-size, fine particles are made of Mg, at least one rare earth element selected from the group consisting of La, Y, Gd and Yb, and O. Each nano-size, fine particle is preferably constituted by a nucleus and a peripheral portion having different compositions. The nano-size, fine particles are preferably amorphous. Each nano-size, fine particle is preferably constituted by a core and a peripheral portion having different compositions.

The nano-size, fine particles are formed by the reprecipitation of trace amounts of sintering aids, which are contained in particles in the growth of silicon nitride grains in the sintering process, in the silicon nitride grains during heat treatment or sintering. The nano-size, fine particles contribute to increasing the thermal conductivity of the silicon nitride grains per se. Therefore, when the nano-size, fine particles exist in the silicon nitride grains, the silicon nitride sintered body has an improved thermal conductivity.

The method for producing a silicon nitride sintered body according to the present invention comprises the steps of mixing 1–50 parts by weight of a first silicon nitride powder having a β-particle ratio of 30–100%, an oxygen content of 0.5 weight % or less, an average particle size of 0.2–10 μm, and an aspect ratio of 10 or less, with 99–50 parts by weight of α-silicon nitride powder having an average particle size of 0.2–4 μm; and sintering the resultant mixture at a temperature of 1,800° C. or higher and pressure of 5 atm or more in a nitrogen atmosphere.

When the β-particle ratio of the first silicon nitride powder is less than 30%, the function of the first silicon nitride powder as growth nuclei is insufficient, if any. Accordingly, abnormal grain growth occurs in the resultant silicon nitride sintered body, failing to achieve the uniform dispersion of large elongated grains in the microstructure of the silicon nitride sintered body and thus resulting in low bending strength of the silicon nitride sintered body.

When the average particle size of the first silicon nitride powder is less than 0.2 μm, it is similarly impossible to obtain a high-thermal conductivity, high-bending strength, silicon nitride sintered body having a microstructure in which columnar particles are uniformly developed. On the other hand, when the average particle size of the first silicon nitride powder is more than 10 μm, the sintered body cannot be made dense.

When the aspect ratio of the first silicon nitride powder is more than 10, the sintered body cannot be made dense, exhibiting a three-point bending strength of less than 600 MPa at room temperature.

A silicon nitride sintered body having as high a thermal conductivity as more than 100 W/mK is produced, when the silicon nitride green body is preliminarily sintered at a temperature of 1,650–1,900° C., particularly 1,750–1,850° C. and then sintered or heat-treated at a temperature of 1,850–1,950° C. and pressure of 0.5 MPa (5 atm) or more for 10 hours or more in a nitrogen atmosphere. A silicon nitride sintered body having as high a thermal conductivity as more than 120 W/mK is produced under the same conditions except for changing the sintering or heat treatment time to 20 hours or more. Increase in thermal conductivity by sintering or heat treatment for such a long period of time is achieved by synergistic effects of the growth of silicon nitride grains and the efficient evaporation of grain boundary components based on high-vapor pressure MgO.

The silicon nitride substrate according to the present invention has a surface condition or texture having a centerline average surface roughness Ra of 0.2–20 μm. If Ra is more than 20 μm, voids are formed locally in bonding interfaces when the metal circuit plate is bonded to the silicon nitride substrate, resulting in drastic decrease in bonding strength. On the other hand, if Ra is less than 0.2 μm, anchoring effects cannot be obtained, still failing to achieve sufficient bonding strength, though the formation of voids can be suppressed.

The silicon nitride substrate according to the present invention is preferably constituted by a silicon nitride sintered body consisting essentially of silicon nitride grains and grain boundaries, an area ratio of the silicon nitride grains being 70–100% in a substrate surface, assuming that the total area ratio of the silicon nitride grains and the grain boundaries is 100%. The silicon nitride substrate meeting these conditions has excellent thermal shock resistance and thermal fatigue resistance.

The distance L between the highest peak of silicon nitride grains exposed on a surface and the lowest bottom of silicon nitride grains or grain boundaries is preferably 1–40 μm. When the distance L is more than 40 μm, voids are formed locally in a bonding interface between the silicon nitride substrate and the metal circuit plate, resulting in low bonding strength. On the other hand, when it is less than 1 μm, anchoring effects cannot be obtained, still failing to achieve sufficient bonding strength, though the formation of voids can be suppressed.

The circuit board of the present invention excellent in thermal shock resistance, thermal cycle resistance and heat dissipation is constituted by a high-strength, high-thermal conductivity, silicon nitride sintered body substrate and a metal circuit plate bonded to the substrate, the silicon nitride sintered body containing Mg and at least one rare earth element selected from the group consisting of La, Y, Gd and Yb, the total amount of the above elements as oxides being 0.6–7 weight % with Mg converted to MgO and rare earth element converted to rare earth oxide $RE_xO_y$. The metal circuit plate is preferably made of Al or Cu.

The thermoelectric module according to the present invention comprises an electrically insulating substrate, electrodes bonded to the electrically insulating substrate, and p-type and n-type thermoelectric semiconductor elements connected in series via the electrodes; the electrically insulating substrate being the above silicon nitride substrate; an as-sintered surface layer being removed from at least bonding areas of the electrodes to the electrically insulating substrate surface; an electrically insulating substrate surface, from which the as-sintered surface layer is removed, having a centerline average surface roughness Ra of 0.01–0.6 μm.

When the as-silicon nitride sintered body is used as an electrically insulating substrate, large pores and roughness existing on a surface (as-sintered surface) of the silicon nitride substrate function as sites of stress concentration, from which cracking starts. Particularly near interfaces between the insulating silicon nitride substrate and the electrodes, cracking propagates.

Not only because large pores and roughness are likely to be formed on a surface of the silicon nitride green body, but because large pores and roughness are likely to be formed by reaction with an atmosphere so gas during the sintering process of a green body, the as-sintered surface of the silicon nitride sintered body generally has as large pores and roughness as about 50 μm or more. Such large pores and roughness function as sites of stress concentration, and the larger the pores and roughness, the likelier the cracking occurs at low stress. It has been found that by removing an as-sintered surface layer containing large pores and roughness from the silicon nitride substrate, it is possible to suppress cracking due to thermal stress in bonding interfaces between the silicon nitride substrate and the electrodes. In view of this, using as a substrate a silicon nitride sintered body, from which an as-sintered surface layer having large pores and roughness are removed by grinding, it has been found that circuit boards and thermoelectric modules in which cracking occurs less likely from the substrate can be obtained.

The electrodes are soldered to the silicon nitride substrate via a plating layer formed on the substrate, with problems that the electrodes easily peel from the plating layer of the substrate. It has been found that the surface roughness of the substrate is important to improve the adhesion of the plating layer to the substrate. As a result of investigation on surface roughness of the silicon nitride substrate from which an as-sintered surface layer is removed, it has been found that the electrodes are unlikely to peel off when the centerline surface roughness Ra is 0.01–0.6 µm. When Ra is less than 0.01 µm, grinding cost is too high, and the substrate surface is too flat to have high bonding strength between the plating layer and the electrodes. When Ra exceeds 0.6 µm, the substrate surface is too rough to have high bonding strength with the plating layer, similarly making it likely that the electrodes peel from the bonding interfaces. As long as the surface roughness Ra is about 0.01–0.6 µm, it is unlikely that cracking occurs in the substrate by pores and roughness on the substrate surface functioning as sites of stress concentration.

From the aspect of grinding efficiency, surface regions of the silicon nitride substrate in which the centerline average surface roughness Ra is adjusted to 0.01–0.6 µm are desirably entire regions to which the electrodes are bonded. Of course, both surfaces of the silicon nitride substrate may be ground entirely to remove an as-sintered surface layer, such that the substrate surfaces have a centerline average surface roughness Ra of 0.01–0.6 µm.

In surface regions of the insulating sintered silicon nitride substrate from which an as-sintered surface layer is removed, bonding areas with electrodes are preferably provided with a plating layer of nickel or a nickel alloy. The thickness of the plating layer is preferably about 0.1–2 µm. When the plating layer is as thin as less than 0.1 µm, sufficient effects as the plating layer cannot be obtained, making it likely that the electrodes peel from the plating layer. On the other hand, when the plating layer is as thick as more than 2 µm, the thermoelectric module has decreased thermal conversion efficiency, because Ni has a lower thermal conductivity than those of Cu and Au.

DESCRIPTION OF THE PREFERRED EMBODIMENTS

Figure 1:
FIG. 1 is a SEM photograph of silicon nitride powder of Sample No. 5 in EXAMPLE 1.

The silicon nitride powder of the present invention has an oxygen content of 0.5 weight % or less. When the silicon nitride sintered body is formed with silicon nitride powder as growth nuclei, the amount of oxygen contained in the silicon nitride grains in the silicon nitride sintered body largely depends on the oxygen content of the silicon nitride powder used as growth nuclei. That is, the larger the oxygen content of the silicon nitride powder used as growth nuclei, the larger the amount of oxygen dissolved in the silicon nitride grains in the silicon nitride sintered body. Oxygen contained in the silicon nitride grains causes the scattering of phonon, which is a thermal conduction medium, resulting in decrease in the thermal conductivity of the silicon nitride sintered body. To achieve as high thermal conductivity as 100 W/mK or more that is impossible in the silicon nitride sintered body, it is necessary that the oxygen content of the silicon nitride powder is suppressed to 0.5 weight % or less to reduce the oxygen content of the finally obtained silicon nitride sintered body.

The contents of Fe and Al in the silicon nitride powder are 100 ppm or less each. When the contents of Fe and Al are more than 100 ppm each, Fe and Al are remarkably dissolved in the silicon nitride grains in the silicon nitride sintered body, causing the scattering of phonon, a thermal conduction medium, in Fe and Al-dissolved portions, thereby reducing the thermal conductivity of the silicon nitride sintered body. Accordingly, to achieve a thermal conductivity of 100 W/mK or more, it is necessary to control the contents of Fe and Al in the silicon nitride powder to 100 ppm or less.

A weight ratio of the first silicon nitride powder prepared by a heat treatment and having a β-particle ratio of 30–100% and the second α-silicon nitride powder is preferably 1/99–50/50. When the silicon nitride powder having a β-particle ratio of 30–100% is less than 1 weight %, a sufficient effects as growth nuclei cannot be obtained, failing to achieve uniform dispersion of large elongated grains in the microstructure of the silicon nitride sintered body, thereby reducing the bending strength of the silicon nitride sintered body. On the other hand, when the first silicon nitride powder is more than 50 weight %, there are too many growth nuclei, causing the silicon nitride grains to come into contact with each other at the grain growth step and thus resulting in hindering of the growth of the silicon nitride grains. As a result, a high-thermal conductivity, silicon nitride sintered body having a microstructure composed of large elongated grains cannot be obtained.

Mg and Y are useful as sintering aids, effective for providing the silicon nitride sintered body with high density. Because these elements have small solubility in the silicon nitride grains in the silicon nitride sintered body, they can keep the thermal conductivity of the silicon nitride sintered body at a high level.

Elements useful as sintering aids like Y, which have small solubility in the silicon nitride grains, are at least one rare earth element selected from the group consisting of La, Ce, Nd, Pm, Sm, Eu, Gd, Dy, Ho, Er, Tm, Yb and Lu. Among them, at least one rare earth element selected from the group consisting of La, Ce, Gd, Dy and Yb is preferable, because it does not make the sintering temperature and pressure too high.

By increasing the heat treatment temperature and elongating the sintering time, the thermal conductivity of the silicon nitride sintered body can be increased to as high as 100 W/mK or more. This is because the thermal conductivity of the silicon nitride grains per se is increased by the growth of the silicon nitride grains, the evaporation of the sintering aid, and the precipitation of nano-size, fine particles in the silicon nitride grains.

Each nano-size, fine particle is constituted by a nucleus having high contents of Mg and Gd, and a peripheral portion having low contents of Mg and Gd, which is formed by the reprecipitation of trace amounts of if sintering aids dissolved in the silicon nitride grains during sintering and heat treatment. The nano-size, fine particles are composed of Si, a main component of the silicon nitride grains, sintering aids such as Mg, Y, Gd, etc., and O, having compositions of, for instance, Si—Mg—Y—O—N, Si—Mg—Gd—O—N, etc. Because these compositions are thermodynamically stable in a glass state, namely in an amorphous state, the nano-size, fine particles are amorphous.

Further, to make good strength and thermal conductivity, it is important to make uniform the size of the silicon nitride grains serving as sites from which fracture initiates.

The control of the surface condition (texture) of silicon nitride substrate of the present invention may be carried out by, for instance, methods for mechanically removing grain boundaries by sand blasting, shot blasting, grid blasting, hydro blasting, etc., or hydrochloric acid or sulfuric acid, etc. methods for dissolving away grain boundaries by acid etching.

To bond a metal plate of copper, aluminum, etc. to the silicon nitride substrate, a blazing method is preferable. In the case of a copper plate, it is preferable to use Ag—Cu alloys containing active metals of Ti, Zr, Hf, etc. as brazing materials. In the case of an aluminum plate, it is preferable to use Al—Si alloys as brazing materials. Further, a metal circuit plate constituted by a plate of copper or aluminum and a bonding layer of a Cu—O or Al—O eutectic compound may be directly bonded to the silicon nitride substrate.

The factors dominating the bonding strength between the metal circuit plate and the silicon nitride substrate are (a) wettability and diffusion of bonding materials, (b) strength of interface products, and (c) interface structure.

For instance, in an active metal method for bonding a metal plate to a silicon nitride substrate with an Ag—Cu alloy containing Ti as a brazing material, the interface bonding strength is largely influenced by the factors (b) and (c). In this case, the interface products is a TiN phase formed in the interface of brazing material/silicon nitride. The details of the step of forming a TiN phase are as follows: When silicon nitride is brought into contact with a brazing material at a heat treatment step, Si and N are dissolved in the brazing material to form a liquid mixed phase. TiN particles are formed as nuclei in liquid phase regions and grow along the bonding interface of silicon nitride and the brazing material. Because TiN particles are formed and grow in the crystal grain boundaries in a particular crystallographic direction, a TiN phase and silicon nitride are crystallographically aligned, resulting in increase in bonding strength. Accordingly, to achieve high bonding strength, it is important that TiN particles are fully precipitated in the interface of the brazing material and silicon nitride.

In a direct bonding method using a liquid phase of a eutectic oxide of copper or aluminum as a bonding material, too, it is necessary to optimize an oxide film formed in the bonding interface. The oxide film consists of a silicate crystal phase and a glassy phase both composed of the sintering aids and $SiO_2$. Specifically, when $Y_2O_3$ is used as a sintering aid, a $Y_2O_3$-$2SiO_2$ crystal phase and a $Y_2O_3$—$SiO_2$ glassy phase are formed. The bonding strength between the metal circuit plate and the silicon nitride substrate largely depends on the compositions of these silicate phase and glassy phase. Accordingly, it is important to control the composition of the oxide film in the direct bonding method.

However, a TiN phase or an oxide film dominating the bonding strength between the metal circuit plate and the silicon nitride substrate is formed only when the substrate surface is in a proper state. In the case of the TiN phase, when the silicon nitride substrate surface has large roughness, the brazing material does not come into contact with the entire surface of the silicon nitride substrate, resulting in the formation of voids in the interface of the brazing material and silicon nitride and thus insufficient bonding. In the case of the oxide film, though the oxide film is formed, the brazing material does not come into contact with the entire surface of the silicon nitride substrate, resulting in insufficient bonding.

When there is extremely little roughness on the surface of the silicon nitride substrate, interface products are formed, but a sufficient anchor effect that the brazing material bites into recesses between the silicon nitride grains cannot be obtained, resulting in decrease in bonding strength. Thus, to obtain sufficient bonding strength, the surface of the silicon nitride substrate should meet the predetermined conditions.

In the silicon nitride substrate of the present invention, an area ratio of silicon nitride grains is preferably 70–100%.

In the case of the active metal method, a TiN phase formed by contact of the brazing material with the silicon nitride grains dominates bonding strength. However, when the percentage of grain boundaries comprising the sintering aids is large, not only the TiN phase but also Si dissolved in the grain boundaries are diffused through the grain boundaries and react with excess Ti to form Ti silicide by 5Ti+ 3Si.$Ti_5Si_3$. Ti silicide has small strength and a thermal expansion coefficient of $9.5 \times 10^{-6}$/K, about 3 times as large as the thermal expansion coefficient ($3.2 \times 10^{-6}$/K) of $Si_3N_4$. As a result, interface peeling takes place between $Si_3N_4$ and $Ti_5Si_3$ due to difference in a thermal expansion coefficient, resulting in drastic decrease in bonding strength. Accordingly, to achieve sufficient bonding strength, it is necessary to reduce the percentage of the grain boundaries.

In the case of the direct bonding method, the oxide film formed in the bonding interface dominates bonding strength. The oxide film comprises a silicate phase and a glassy phase both composed of the sintering aid and $SiO_2$. When the sintering aid is $Y_2O_3$, a $Y_2O_3$-$2SiO_2$ phase and a $Y_2O_3$—$SiO_2$ glassy phase are formed. When there are a lot of the grain boundaries comprising the sintering aid in the bonding interface, a high percentage of the glassy phase is formed, resulting in increase in bonding strength. However, further increase in the percentage of the grain boundaries leads to the formation of a higher percentage of the silicate phase having low strength, resulting in extreme decrease in strength.

Accordingly, in both bonding methods, there is an adequate range of a ratio of the silicon nitride grains to grain boundaries. In the silicon nitride substrate of the present invention, an area ratio of the silicon nitride grains is preferably 70–100%.

Because of excellent strength, toughness and thermal conductivity, the sintered silicon nitride substrate of the present invention is suitable for members for electronics parts, for instance, various substrates for power semiconductors, multi-chip modules, etc., thermal conduction plates for Peltier modules, heat sinks for various heat-generating components, etc.

When the silicon nitride sintered body of the present invention is used for a substrate for a semiconductor element, the substrate is unlikely subjected to cracking even if it undergoes repeated thermal cycles by the operation of the semiconductor chips, exhibiting extremely improved thermal shock resistance and thermal cycle resistance and thus excellent reliability. Also, even when semiconductor chips designed to have higher output and high integration are mounted onto the silicon nitride sintered body, the silicon nitride sintered body suffers from little deterioration in thermal shock resistance and thermal cycle resistance, exhibiting excellent heat dissipation. Further, because the silicon nitride sintered body of the present invention has excellent mechanical properties, substrates constituted thereby have high strength, making it possible to simplify the structure of a substrate unit per se.

When the silicon nitride sintered body of the present invention excellent in thermal cycle resistance is used for a thermal conduction substrate for a Peltier module, the substrate does not suffer from cracking and thus shows high reliability even under repeated thermal cycles by switching of polarity of voltage applied to the Peltier module.

The silicon nitride sintered body of the present invention can be widely used not only for electronics parts but also for structural members requiring high thermal resistance such as thermal shock resistance and thermal fatigue resistance, etc. The structural members include various heat exchanger parts and heat engine parts, and further heater tubes, stokes, die cast sleeves, propellers for stirring melts, ladles, thermocouple protective pipes, etc. used for molten metals of aluminum, zinc, etc. The silicon nitride sintered body may also be used for sink rolls, support rolls, bearings, shafts, etc. for molten metal plating lines of aluminum, zinc, etc. as materials having sufficient resistance to cracking by rapid cycles of heating and cooling. Also, when it is used for rolls, squeezing rolls, guide rollers, wire-drawing dies, tool chips, etc. in the field of working steel or nonferrous metals, it is less worn and resistant to thermal stress cracking because of excellent thermal fatigue resistance and thermal shock resistance and good heat dissipation at the time of contacting with works.

The silicon nitride sintered body of the present invention can further be used for sputtering targets suitable, for instance, for the formation of electrically insulating films on MR heads, GMR heads, TMR heads, etc. assembled in magnetic-recording apparatuses, and for the formation of wear resistance films for thermal heads of thermal transfer printers, etc. Coatings formed by sputtering essentially have high thermal conductivity and breakdown voltage. Because electric insulation coatings formed with the sputtering targets for MR heads, GMR heads or TMR heads have high thermal conductivity and breakdown voltage, the insulation coatings may be made thinner. Because silicon nitride coatings for thermal heads formed using the sputtering targets have excellent wear resistance and thermal conductivity, the thermal heads can have a high printing speed.

The present invention will be described in further detail referring to the following examples without intention of limiting the scope of the present invention thereto.

EXAMPLE 1

Silicon nitride powder formed by an imide decomposition method and having an oxygen content of less than 1.0 weight % as converted to $SiO_2$ and an average particle size of 0.2–2.0 μm was charged into a crucible made of BN, heat-treated at 1,400° C.–1,950° C. for 1–20 hours in an $N_2$ atmosphere of normal pressure to 1.0 MPa (10 atm), and then cooled to room temperature to form a first silicon nitride powder. The production conditions of each sample are shown in Table 1 on the columns of Sample Nos. 1–11, and the β-particle ratio, oxygen content, impurities (Fe, Al), average particle size and aspect ratio of each first silicon nitride powder are shown in Table 2 on the columns of Sample Nos. 1–11.

The impurities (Fe, Al) in the first silicon nitride powder were analyzed by inductively coupled plasma emission spectroscopy (ICP) method. The oxygen content of the first silicon nitride powder was measured by an infrared thermal absorption method. The β-particle ratio of the first silicon nitride powder was calculated from the intensity of X-ray diffraction peaks measured by using Cu-·α ray by-the following formula (1):

$$\beta\text{-particle ratio }(\%) = [(I_{\beta(101)} + I_{\beta(210)})/(I_{\beta(101)} + I_{\beta(210)} + I_{\alpha(102)} + I_{\alpha(201)})] \times 100 \quad (1),$$

$I_{\beta(101)}$: diffraction peak intensity of β-$Si_3N_4$ at (101) plane, $I_{\beta(210)}$: diffraction peak intensity of β-$Si_3N_4$ at (210) plane, $I_{\alpha(102)}$: diffraction peak intensity of α-$Si_3N_4$ at (102) plane, and $I_{\alpha(210)}$: diffraction peak intensity of α-$Si_3N_4$ at (210) plane.

The average particle size and aspect ratio of the first silicon nitride powder were determined by arbitrarily selecting 500 silicon nitride grains in total in a field of 200 μm×500 μm in an SEM photograph (2,000 times), measuring the minimum and maximum diameters of each particle by image analysis, and calculating average values therefrom.

FIG. 1 is a SEM photograph of one example (Sample No. 5) of the resultant first silicon nitride powder. This silicon nitride powder had a β-particle ratio of 100%, an oxygen content of 0.4 weight %, an Fe content of 50 ppm, and an Al content of 70 ppm. This silicon nitride powder had parallel grooves in crystal grains in parallel with their longitudinal direction. This is a feature peculiar to a case where grain growth occurs via a gas phase, and it became remarkable as the silicon nitride powder had an extremely smaller oxygen content.

10–30 weight % of the above first silicon nitride powder based on β-$Si_3N_4$, 90–70 weight % of a second α-silicon nitride ($Si_3N_4$) powder having an oxygen content of 0.3–1.5 weight % and an average particle size of 0.5 μm, and as sintering aids MgO powder (an average particle size: 0.2 μm) and $RE_xO_y$ powder shown in Table 3 (average particle size: 0.2–2.0 μm) in parts by weight shown in Table 3 per 100 parts by weight of the total of the first and second silicon nitride powders were charged into a ball-milling pot filled with ethanol containing 2 weight % of a dispersant (tradename "Leogard GP"), and mixed. The resultant mixture was vacuum-dried and granulated through a 150-μm-opening sieve. The resultant granules were CIP-molded at pressure of 3 tons by a press apparatus to form disc-shaped green bodies of 20 mm in diameter and 10 mm in thickness and those of 100 mm in diameter and 15 mm in thickness. Each green body was sintered at a temperature of 1,750–1,900° C. and a pressure of 0.9 MPa (9 atm) for 5–10 hours in a nitrogen gas atmosphere.

Sintered silicon nitride pieces of 10 mm in diameter and 3 mm in thickness for measuring thermal conductivity and density, and sintered silicon nitride pieces of 3 mm in thickness, 4 mm in width and 40 mm in length for bending test were cut out from each silicon nitride sintered body. The density of each sintered silicon nitride piece was calculated from dimension measured by a micrometer and weight. The thermal conductivity of the sintered silicon nitride pieces was calculated from specific heat and thermal diffusivity measured at room temperature by a laser flush method. The three-point bending strength of the sintered silicon nitride pieces was measured at room temperature according to JIS R1606. The production conditions of the silicon nitride sintered body are shown in Table 3 on the columns of Sample Nos. 1–11, and the evaluation results are shown in Table 4 on the columns of Sample Nos. 1–11.

COMPARATIVE EXAMPLE 1

The first silicon nitride powders having different β ratios were produced and evaluated, and various silicon nitride sintered bodies were produced from the first silicon nitride powders and evaluated, in the same manner as in EXAMPLE 1 except for changing the production conditions to those shown in Tables 1–3 on the columns of Sample Nos. 31–41. The production conditions of the first silicon nitride powders and the silicon nitride sintered bodies are shown in Tables 1–3 on the columns of Sample Nos. 31–41, and the evaluation results are shown in Table 4 on the columns of Sample Nos. 31–41.

TABLE 1

| | Starting Silicon Nitride Powder | | | Heat Treatment Conditions | | |
|---|---|---|---|---|---|---|
| Sample No. | Oxygen (wt. %) | Specific Surface Area ($m^2/g$) | Av. Particle Size (μm) | Pressure (MPa) | Temp. (° C.) | Time (hr) |
| 1 | 0.5 | 10.0 | 0.7 | 0.9 | 1900 | 10 |
| 2 | 0.5 | 10.0 | 0.7 | 0.9 | 1900 | 10 |
| 3 | 0.5 | 10.0 | 0.7 | 0.9 | 1900 | 10 |
| 4 | 0.5 | 10.0 | 0.7 | 0.9 | 1900 | 10 |
| 5 | 0.5 | 10.0 | 0.7 | 0.9 | 1950 | 10 |
| 6 | 0.5 | 10.0 | 0.7 | 0.9 | 1950 | 10 |
| 7 | 0.4 | 10.0 | 0.7 | 0.9 | 1950 | 10 |
| 8 | 0.4 | 10.0 | 0.7 | 0.9 | 1950 | 10 |
| 9 | 0.4 | 11.0 | 0.6 | 0.9 | 1950 | 10 |
| 10 | 0.4 | 11.0 | 0.6 | 0.9 | 1950 | 10 |
| 11 | 0.5 | 11.0 | 0.6 | 0.9 | 1950 | 10 |
| 31 | 0.5 | 11.0 | 0.6 | 0.5 | 1700 | 10 |
| 32 | 1.2 | 12.0 | 0.55 | 0.9 | 1800 | 10 |
| 33[1] | 0.5 | 12.0 | 0.6 | 0.9 | 1900 | 5 |
| 34[2] | 0.5 | 12.0 | 0.6 | 0.9 | 1900 | 5 |
| 35 | 1.0 | 100 | 0.08 | 0.9 | 1900 | 10 |
| 36 | 1.0 | 2 | 1.5 | 0.9 | 1950 | 20 |
| 37 | 0.5 | 12.0 | 0.6 | 0.9 | 1950 | 40 |
| 38 | 0.5 | 10.0 | 0.7 | 0.9 | 1950 | 10 |
| 39 | 0.5 | 10.0 | 0.7 | 0.9 | 1950 | 10 |
| 40 | 0.5 | 10.0 | 0.7 | 0.9 | 1900 | 10 |
| 41 | 0.5 | 10.0 | 0.7 | 0.9 | 1900 | 10 |

Note [1]Starting silicon nitride powder containing 550 ppm of Fe.
[2]Starting silicon nitride powder containing 600 ppm of Al.

TABLE 2

| | First Silicon Nitride Powder | | | | | |
|---|---|---|---|---|---|---|
| | β | Impurities | | | Average | |
| Sample No. | Ratio (%) | O (wt %) | Fe (ppm) | Al (ppm) | Particle Size (μm) | Aspect Ratio |
| 1 | 90 | 0.3 | 30 | 50 | 2 | 5 |
| 2 | 90 | 0.3 | 30 | 50 | 2 | 5 |
| 3 | 90 | 0.3 | 30 | 50 | 2 | 5 |
| 4 | 90 | 0.3 | 50 | 70 | 5 | 6 |
| 5 | 100 | 0.4 | 50 | 70 | 5 | 6 |
| 6 | 100 | 0.4 | 50 | 70 | 5 | 6 |
| 7 | 100 | 0.4 | 70 | 50 | 3 | 6 |
| 8 | 100 | 0.4 | 70 | 50 | 3 | 4 |
| 9 | 100 | 0.4 | 70 | 50 | 2 | 4 |
| 10 | 100 | 0.3 | 50 | 50 | 2 | 4 |
| 11 | 100 | 0.3 | 50 | 50 | 2 | 5 |
| 31 | 25 | 0.3 | 30 | 50 | 2 | 5 |
| 32 | 90 | 1.0 | 30 | 50 | 2 | 5 |
| 33 | 90 | 0.3 | 500 | 50 | 2 | 5 |
| 34 | 100 | 0.3 | 30 | 500 | 2 | 5 |
| 35 | 100 | 0.3 | 30 | 30 | 0.1 | 5 |
| 36 | 100 | 0.2 | 30 | 20 | 12.0 | 5 |
| 37 | 100 | 0.2 | 50 | 20 | 3 | 15 |
| 38 | 100 | 0.2 | 50 | 20 | 3 | 5 |
| 39 | 100 | 0.2 | 50 | 40 | 3 | 5 |
| 40 | 90 | 0.4 | 50 | 50 | 2 | 5 |
| 41 | 90 | 0.4 | 50 | 50 | 2 | 5 |

TABLE 3

| Sample No. | Silicon Nitride Powder (parts by weight) First Powder[1] | Silicon Nitride Powder (parts by weight) Second Powder[2] | Sintering Aid (parts by weight) MgO | Sintering Aid (parts by weight) $Re_xO_y$ $Y_2O_3$ | Sintering Aid (parts by weight) $Re_xO_y$ Others | Weight Ratio of $MgO/Re_xO_y$ | Temperature (° C.) | Time (Hr) | Nitrogen Pressure (MPa) |
|---|---|---|---|---|---|---|---|---|---|
| 1  | 10  | 90   | 1.0 | —   | —         | —   | 1,800 | 10 | 0.9 |
| 2  | 10  | 90   | 7.0 | —   | —         | —   | 1,850 | 10 | 0.9 |
| 3  | 10  | 90   | 3.0 | 0.1 | —         | 30  | 1,850 | 10 | 0.9 |
| 4  | 15  | 85   | 3.0 | 1.0 | —         | 3.0 | 1,850 | 10 | 0.9 |
| 5  | 15  | 85   | 3.0 | —   | 1.0 $La_2O_3$ | 3.0 | 1,850 | 10 | 0.9 |
| 6  | 15  | 85   | 3.0 | —   | 1.0 $CeO_2$   | 3.0 | 1,850 | 10 | 0.9 |
| 7  | 30  | 70   | 3.0 | —   | 1.0 $Dy_2O_3$ | 3.0 | 1,850 | 10 | 0.9 |
| 8  | 30  | 70   | 3.0 | —   | 1.0 $Gd_2O_3$ | 3.0 | 1,850 | 10 | 0.9 |
| 9  | 30  | 70   | 3.0 | —   | 1.0 $Yb_2O_3$ | 3.0 | 1,850 | 10 | 0.9 |
| 10 | 30  | 70   | 3.0 | 1.0 | 1.0 $La_2O_3$ | 1.5 | 1,850 | 10 | 0.9 |
| 11 | 30  | 70   | 3.0 | 1.0 | 1.0 $Yb_2O_3$ | 1.5 | 1,850 | 10 | 0.9 |
| 31 | 10  | 90   | 3.0 | —   | 1.0 $Yb_2O_3$ | 3.0 | 1,850 | 5  | 0.9 |
| 32 | 10  | 90   | 3.0 | 1.0 | —         | 3.0 | 1,850 | 5  | 0.9 |
| 33 | 10  | 90   | 3.0 | 1.0 | —         | 3.0 | 1,850 | 5  | 0.9 |
| 34 | 10  | 90   | 3.0 | 1.0 | —         | 3.0 | 1,850 | 5  | 0.9 |
| 35 | 10  | 90   | 3.0 | 1.0 | —         | 3.0 | 1,900 | 5  | 0.9 |
| 36 | 10  | 90   | 3.0 | 1.0 | —         | 3.0 | 1,850 | 5  | 0.9 |
| 37 | 10  | 90   | 3.0 | 1.0 | —         | 3.0 | 1,850 | 5  | 0.9 |
| 38 | 0.5 | 99.5 | 3.0 | 1.0 | —         | 3.0 | 1,900 | 5  | 0.9 |
| 39 | 60  | 40   | 3.0 | 1.0 | —         | 3.0 | 1,850 | 5  | 0.9 |
| 40 | 5   | 95   | 0.5 | —   | —         | —   | 1,900 | 5  | 0.9 |
| 41 | 5   | 95   | 8.0 | —   | —         | —   | 1,850 | 5  | 0.9 |

Note: [1]The first powder is silicon nitride powder shown in Table 1.
[2]The second powder is α-silicon nitride powder.

TABLE 4

| Sample No. | Amount of First Silicon Nitride Powder (wt %) | Density (%) | Thermal Conductivity (W/mK) | Bending Strength (MPa) |
|---|---|---|---|---|
| 1  | 10  | 99.1 | 110 | 850 |
| 2  | 10  | 99.0 | 115 | 820 |
| 3  | 10  | 99.2 | 120 | 810 |
| 4  | 15  | 99.1 | 125 | 790 |
| 5  | 15  | 98.6 | 130 | 780 |
| 6  | 15  | 99.0 | 140 | 765 |
| 7  | 30  | 98.9 | 155 | 720 |
| 8  | 30  | 98.7 | 150 | 710 |
| 9  | 30  | 98.8 | 145 | 720 |
| 10 | 30  | 99.0 | 140 | 705 |
| 11 | 30  | 98.9 | 125 | 710 |
| 31 | 10  | 99.5 | 70  | 520 |
| 32 | 10  | 99.6 | 70  | 700 |
| 33 | 10  | 99.0 | 65  | 680 |
| 34 | 10  | 99.1 | 55  | 680 |
| 35 | 10  | 99.2 | 60  | 700 |
| 36 | 10  | 85.0 | 60  | 560 |
| 37 | 10  | 86.0 | 75  | 550 |
| 38 | 0.5 | 99.3 | 77  | 580 |
| 39 | 60  | 85.0 | 70  | 580 |
| 40 | 5   | 81.0 | 40  | 500 |
| 41 | 5   | 99.0 | 55  | 620 |

The following was found from the data of Sample Nos. 1–11 in Tables 1–4.

(1) The silicon nitride sintered body formed by adding 1–50 weight % of silicon nitride powder (β-particle ratio: 30% or more, oxygen content: 0.5 weight % or less, Fe content: 100 ppm or less, Al content: 100 ppm or less, average particle size: 0.2–10 μm, and aspect ratio: 10 or less) as nucleating particles has a thermal conductivity of 100 W/mK or more and a three-point bending strength of 600 MPa or more at room temperature.

(2) While the conventional silicon nitride sintered body has a thermal conductivity of about 40 W/mK, the silicon nitride sintered body of the present invention has a drastically higher thermal conductivity.

(3) The silicon nitride sintered body having the total content of sintering aids of 0.6–7.0 weight % and a $MgO/RE_xO_y$ weight ratio of 1–70, with Mg converted to MgO and Y, La, Ce, Dy, Gd and Yb converted to rare earth oxides $RE_xO_y$ has a thermal conductivity of 100 W/mK or more and a bending strength of 600 MPa or more.

On the other hand, the following was found from the data of Sample Nos. 31–41 of COMPARATIVE EXAMPLE 1 in Tables 1–4.

(1) With respect to Sample No. 31, when the β-particle ratio of silicon nitride grains is less than 30%, the resultant silicon nitride sintered body has a remarkably low bending strength of about 500 MPa.

(2) With respect to Sample No. 32, when the content of oxygen inevitably contained in the silicon nitride powder is more than 0.5 weight %, the resultant silicon nitride sintered body has a thermal conductivity as low as 70 W/mK or less.

(3) With respect to Sample Nos. 33 and 34, when the contents of Fe and Al contained as impurities in the silicon nitride powder are more than 100 ppm each, the resultant silicon nitride sintered body has a thermal conductivity decreased to 65 W/mK or less.

(4) With respect to Sample Nos. 35 and 36, when the average particle size of the silicon nitride powder is less than 0.2 μm, the resultant silicon nitride sintered body has as low a thermal conductivity as 60 W/mK or less, and when the average particle size is more than 10 μm, the resultant silicon nitride sintered body is not dense and thus has as low a thermal conductivity as 60 W/mK or less and as low a bending strength as less than 600 MPa.

(5) With respect to Sample No. 37, when the aspect ratio of the silicon nitride powder is more than 10, the resultant silicon nitride sintered body is not dense and thus has as low a bending strength as less than 600 MPa.

(6) With respect to Sample Nos. 38 and 39, when the amount of the silicon nitride powder added is less than 1.0 weight %, the resultant silicon nitride sintered body has as low a bending strength as less than 600 MPa, and when it is more than 50 weight %, the resultant silicon nitride sintered body has as low a thermal conductivity as 70 W/mK or less.

(7) With respect to Sample Nos. 40 and 41, when the total amount of the sintering aids is less than 0.6 weight %, the resultant silicon nitride sintered body has a low density and thus extremely low thermal conductivity and bending strength. On the other hand, when the total amount of the sintering aids exceeds 7.0 weight %, a sufficient glassy phase is formed in the sintering process to produce a dense silicon nitride sintered body, the silicon nitride sintered body has a thermal conductivity decreased to 60 W/mK or less because of increase in grain boundaries having low thermal conductivity.

EXAMPLE 2

Added to 10 weight % of the first silicon nitride powder having a β-particle ratio of 30% or more, which was produced in the same manner as in EXAMPLE 1, and 86 weight % of α-silicon nitride powder were 3 weight % of MgO and 1 weight % of $Y_2O_3$ as sintering aids to form a mixed powder. The resultant mixed powder was charged into a resin ball-milling pot filled with a solution of a 2-weight-% amine dispersant in toluene/butanol together with silicon nitride balls as a pulverization medium, and mixed for 48 hours. 15 parts by weight of a polyvinyl-type, organic binder and 5 parts by weight of a plasticizer (dimethyl phthalate) were added to 100 parts by weight of the mixed powder in the pot and mixed for 48 hours to form a slurry. This slurry was cast to a green sheet by a doctor blade method. By heating the resultant green sheet at 400–600° C. for 2–5 hours in the air, the organic binder was removed.

The degreased green body was sintered at 1,850° C. and 0.9 MPa (9 atm) for 5 hours in a nitrogen atmosphere, heat-treated at 1,900° C. for 24 hours in the same nitrogen atmosphere, and then cooled to room temperature. The resultant sintered silicon nitride sheet was machined to produce a power module substrate 12 of 50 mm in length, 50 mm in width and 0.6 mm in thickness.

Figure 2:
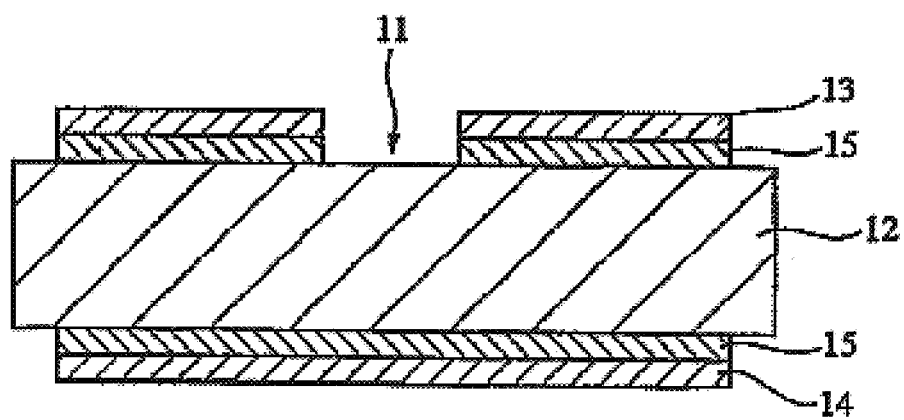
FIG. 2 is a cross-sectional view showing a circuit board comprising the sintered silicon nitride substrate in EXAMPLE 2.

As shown in FIG. 2, a copper circuit plate 13 and a copper plate 14 were respectively bonded to front and rear surfaces of the sintered silicon nitride substrate 12 with a brazing material 15 to produce a circuit board in 11.

The tests of three-point bending strength and thermal cycle resistance were carried out on the circuit board 11. The thermal cycle resistance test comprised repeating a thermal cycle comprising cooling at −40° C. for 30 minutes, keeping at room temperature for 10 minutes, and heating at 125° C. for 30 minutes, to count the number of cycles until the circuit board 11 was cracked.

As a result, it was found that the circuit board 11 had as large a bending strength as 600 MPa or more, substantially free from cracking due to fastening of the circuit board 11 at a mounting step and due to thermal stress at a soldering step. Thus, the production yield of semiconductor power modules comprising circuit boards 11 can drastically be improved. It was also confirmed that the sintered silicon nitride substrate 12 was free from cracking and peeling of a copper circuit plate 13 after 1,000 cycles of temperature elevation and decrease, having excellent durability and reliability. Also, even after 1,000 cycles, the sintered silicon nitride substrate 12 did not undergo decrease in breakdown voltage.

EXAMPLE 3

Added to 10 weight % of the first silicon nitride powder having a β-particle ratio of 30% or more, which was produced in the same manner as in EXAMPLE 1, and 86 weight % of α-silicon nitride powder were 1 weight % of MgO and 3 weight % of $Gd_2O_3$ as sintering aids to form a mixed powder. The mixed powder was charged into a ball-milling pot filled with ethanol containing 2 weight % of a dispersant (Leogard GP), and mixed. The resultant mixture was vacuum-dried and granulated through a 150-μm-opening sieve. It was then CIP-molded at a pressure of 3 tons by a press apparatus to form disc-shaped green bodies of 20 mm in diameter and 10 mm in thickness and those of 100 mm in diameter and 15 mm in thickness. Each of the resultant green bodies was sintered at a temperature of 1,850° C.–1,950° C. and a pressure of 0.7–0.9 MPa (7 atm–9 atm) for 5–40 hours in a nitrogen gas atmosphere. The production conditions of the first silicon nitride powder are shown in Table 5, the properties of the resultant first silicon nitride powder are shown in Table 6, and the production conditions of the silicon nitride sintered body are shown in Table 7.

Figure 3A:
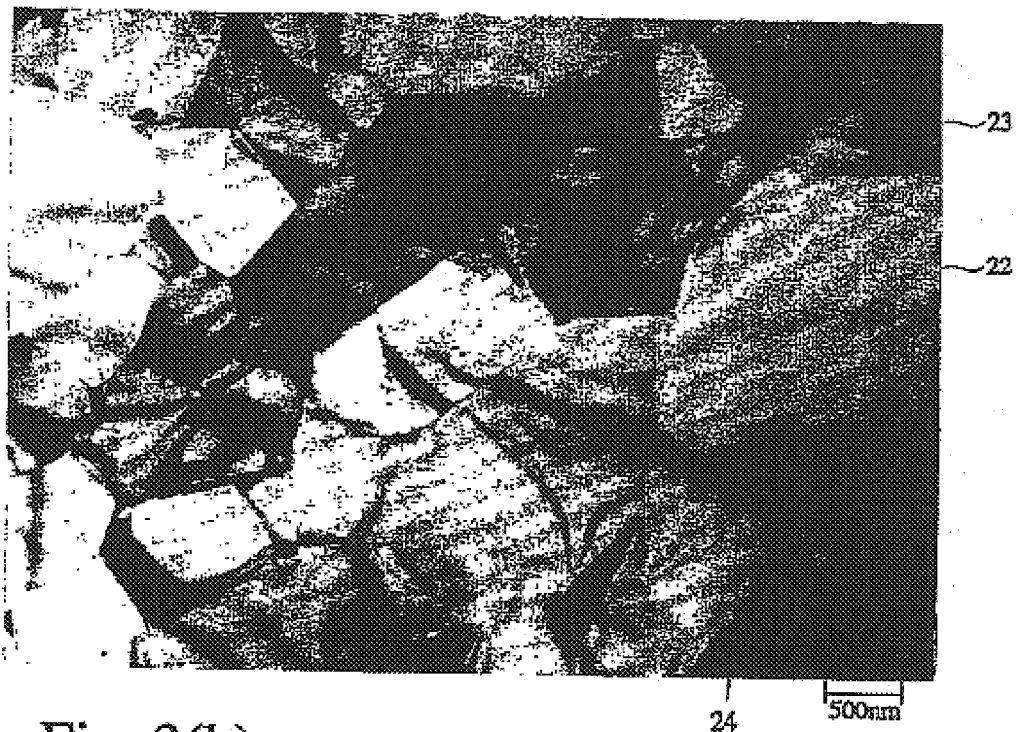
FIG. 3(a) is a transmission electron micrograph (TEM) of the silicon nitride sintered body of Sample 52 in EXAMPLE 3.
Figure 4:
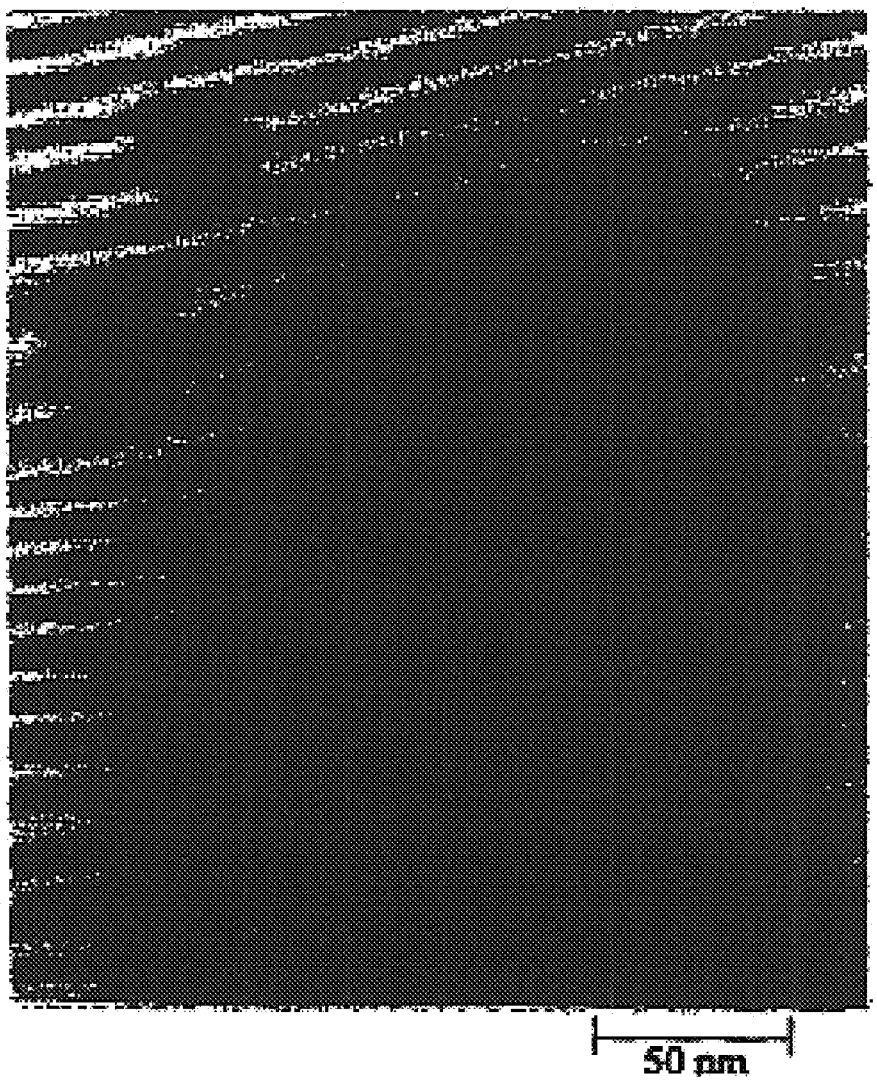
FIG. 4 is a scanning transmission electron micrograph (STEM) of the silicon nitride sintered body of Sample 52 in EXAMPLE 3.
Figure 5:
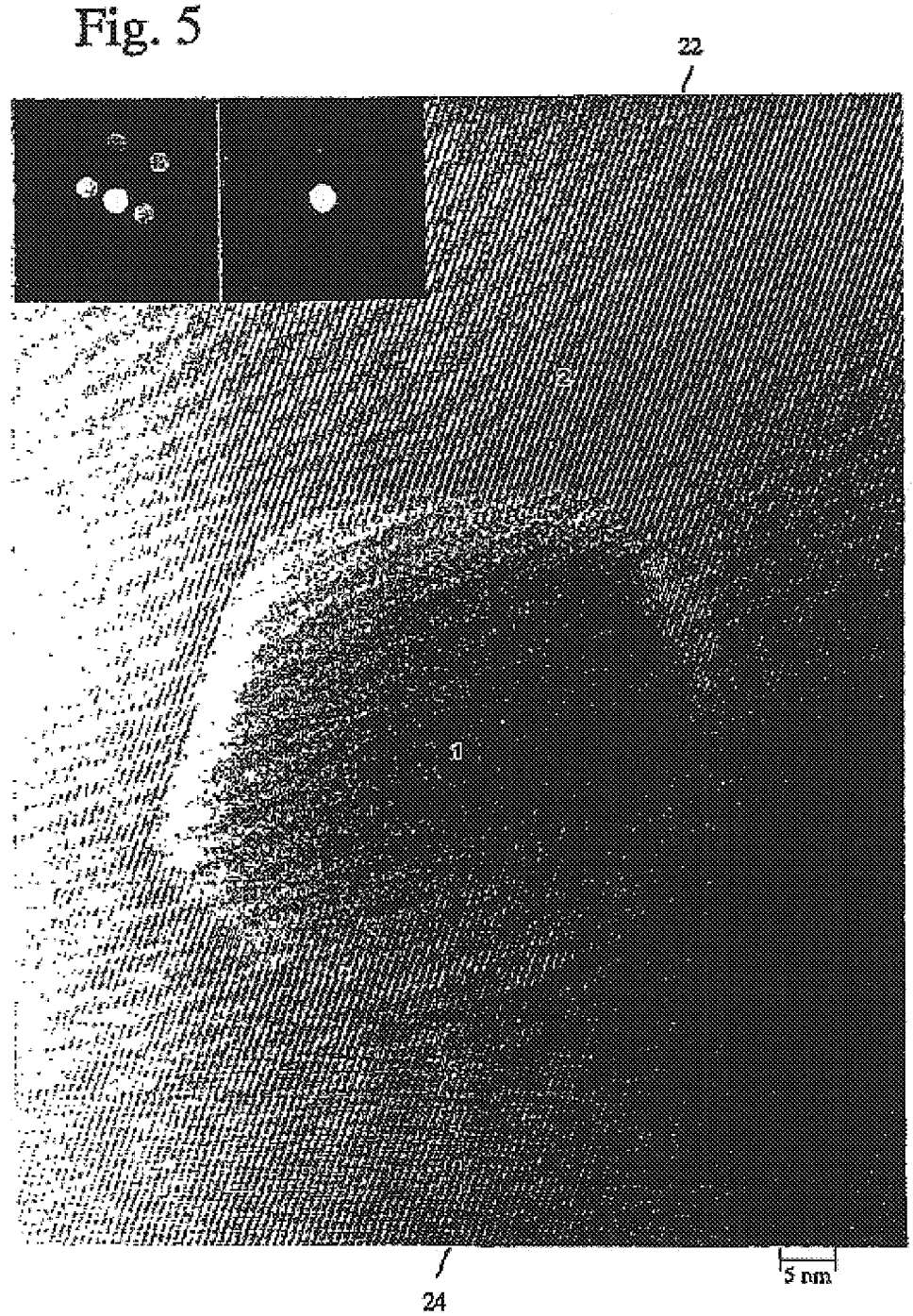
FIG. 5 is a high-resolution photograph of nano-size, fine particles precipitated in silicon nitride grains in the silicon nitride sintered body of Sample 52 in EXAMPLE 3.

The microstructure of the resultant silicon nitride sintered body was observed by a field emission-type, transmission electron microscope ("HF2100" available from Hitachi, Ltd.) at a magnitude of 10,000–600,000 times. Also, the composition of nano-size, fine particles in the silicon nitride sintered body was analyzed by an energy dispersive X-ray spectroscopy (EDX). FIG. 3(a) is a TEM photograph of the silicon nitride sintered body (Sample No. 52 in Table 7), FIG. 4 is a STEM photograph of the silicon nitride sintered body (Sample No. 52) near a portion having nano-size, fine particles, and FIG. 5 is a high-resolution photograph of the nano-size, fine particles.

In the silicon nitride sintered body of Sample No. 52, EDX analysis of each element in the nucleus and peripheral portion of each nano-size, fine particle revealed that the nucleus contained 18.0 weight % of Si, 7.1 weight % of Mg, 60.7 weight % of Gd, 13.2 weight % of O, and 1.0 weight % of N, and that the peripheral portion contained 25.2 weight % of Si, 6.4 weight % of Mg, 52.2 weight % of Gd, 14.8 weight % of O, and 1.4 weight % of N. It is clear from this comparison that the contents of Mg and Gd are higher in the nucleus than in the peripheral portion.

Cut out from each silicon nitride sintered body were sintered body pieces of 10 mm in diameter and 3 mm in thickness for measuring thermal conductivity and density, and sintered body pieces of 3 mm in thickness, 4 mm in width and 40 mm in length for bending test. The density of each sintered silicon nitride piece was calculated from dimension measured by a micrometer and weight. The thermal conductivity of the sintered silicon nitride pieces was calculated from specific heat and thermal diffusivity measured at room temperature by a laser flush method. The three-point bending strength of the sintered silicon nitride pieces was measured at room temperature according to JIS R1606.

The production conditions of the first silicon nitride powder are shown in Table 5 on the columns of Sample Nos. 51–55, and the properties of the first silicon nitride powder are shown in Table 6 on the columns of Sample Nos. 51–55. The production conditions and evaluation results of the silicon nitride sintered body are shown in Table 7 on the columns of Sample Nos. 51–55.

COMPARATIVE EXAMPLE 2

Figure 3B:
FIG. 3(b) is a transmission electron micrograph (TEM) of the silicon nitride sintered body of Sample 62 in COMPARATIVE EXAMPLE 2.

Various silicon nitride sintered bodies were produced and evaluated in the same manner as in EXAMPLE 3 except for using the production conditions shown in Table 7. FIG. 3(b) is a TEM photograph of silicon nitride sintered body of COMPARATIVE EXAMPLE 2 (Sample No. 62 in Table 7). The production conditions and evaluation results of the silicon nitride sintered body are shown in Table 7 on the columns of Sample Nos. 60–62.

TABLE 5

| | Starting Silicon Nitride Powder | | | Sintering Conditions | | |
|---|---|---|---|---|---|---|
| Sample No. | Oxygen (wt. %) | Specific Surface Area (m²/g) | Av. Particle Size (μm) | Pressure (MPa) | Temp. (°) | Time (hr) |
| 51 | 0.5 | 10.0 | 0.7 | 0.9 | 1950 | 10 |
| 52 | 0.5 | 10.0 | 0.7 | 0.9 | 1950 | 10 |
| 53 | 0.5 | 10.0 | 0.7 | 0.9 | 1950 | 10 |
| 54 | 0.5 | 10.0 | 0.7 | 0.9 | 1950 | 10 |
| 55 | 0.5 | 10.0 | 0.7 | 0.9 | 1900 | 10 |
| 60 | 1.2 | 12.0 | 0.55 | 0.9 | 1800 | 10 |
| 61 | 1.2 | 12.0 | 0.55 | 0.9 | 1800 | 10 |
| 62 | 1.2 | 12.0 | 0.55 | 0.9 | 1800 | 10 |

TABLE 6

| | First Silicon Nitride Powder | | | | | |
|---|---|---|---|---|---|---|
| | β Ratio | Impurities | | | Average | |
| Sample No. | (%) | O (wt %) | Fe (ppm) | Al (ppm) | Particle Size (μm) | Aspect Ratio |
| 51 | 100 | 0.3 | 30 | 50 | 2 | 5 |
| 52 | 100 | 0.3 | 30 | 50 | 2 | 5 |
| 53 | 100 | 0.3 | 30 | 50 | 2 | 5 |
| 54 | 100 | 0.3 | 30 | 50 | 2 | 5 |
| 55 | 90 | 0.3 | 30 | 50 | 2 | 5 |
| 60 | 90 | 1.0 | 30 | 50 | 2 | 5 |
| 61 | 90 | 1.0 | 30 | 50 | 2 | 5 |
| 62 | 90 | 1.0 | 30 | 50 | 2 | 5 |

TABLE 7

| | Sintering Conditions | | | | Thermal |
|---|---|---|---|---|---|
| Sample No. | Temperature (° C.) | Time (hrs) | Nitrogen Pressure (MPa) | Fine Particles | Conductivity (W/mK) |
| 51 | 1,900 | 10 | 0.7 | Yes | 110 |
| 52 | 1,950 | 20 | 0.7 | Yes | 125 |
| 53 | 1,950 | 30 | 0.7 | Yes | 138 |
| 54 | 1,950 | 40 | 0.7 | Yes | 145 |
| 55 | 1,900 | 20 | 0.9 | Yes | 115 |
| 60 | 1,850 | 5 | 0.7 | No | 68 |
| 61 | 1,900 | 5 | 0.9 | No | 70 |
| 62 | 1,950 | 5 | 0.7 | No | 80 |

As shown in Table 7, any sintered bodies containing nano-size, fine particles in silicon nitride grains had a thermal conductivity of 100 W/mK or more. On the other hand, any sintered bodies containing no nano-size, fine particles in silicon nitride grains had a thermal conductivity of less than 100 W/mK.

EXAMPLE 4

Added to 10 weight % of the first silicon nitride powder having a β-particle ratio of 30% or more, which was produced in the same manner as in EXAMPLE 1, and 86 weight % of α-silicon nitride powder were 3 weight % of MgO and 1 weight % of $Y_2O_3$ as sintering aids, to form a mixed powder. The mixed powder was charged into a resin ball-milling pot filled with a solution of a 2-weight-% amine dispersant in toluene/butanol together with silicon nitride balls as a pulverization medium, and mixed for 48 hours. 12.5 parts by weight of an organic binder and 4.2 parts by weight of a plasticizer (dimethyl phthalate) were added to 83.3 parts by weight of the mixed powder in the pot, and mixed for 48 hours to form a slurry. This slurry was cast to green sheets by a doctor blade method.

Each green sheet was heated at 400–600° C. for 2–5 hours in the air to remove the organic binder, and the degreased green sheet was sintered at 1,850° C. and 0.9 MPa (9 atm) for 5 hours in a nitrogen atmosphere, heat-treated at 1,900° C. for 24 hours in the same nitrogen atmosphere, and then cooled to room temperature. The resultant sheet-shaped silicon nitride sintered body was machined and sand-blasted to control its surface condition, thereby obtaining a silicon nitride substrate of 50 mm in length, 50 mm in width and 0.6 mm in thickness for semiconductor power modules. The sand blasting conditions are as follows:

Feed speed of substrate: 20 cm/minute,
Length of treating zone: 80 cm,
Number of nozzles: 4,
Blasting pressure of nozzle: 0.35 MPa,
Blasting angle to substrate surface: 30°, and
Grinder particles: alumina #240.

Because the grain boundaries on the sintered body surface are removed by sand blasting, it is possible to obtain silicon nitride substrates having suitably adjusted centerline average surface roughness Ra, area ratios of silicon nitride grains and grain boundaries, and peak-bottom distance L, by controlling sand blasting conditions (feed speed of substrate, length of treating zone, number of nozzles, blasting pressure, blasting angle to substrate surface, types and particle size of grinder particles, etc.).

Figure 6:
FIG. 6 is a graph showing the measurement results of the surface silicon nitride substrate of EXAMPLE 4 by a needle contact-type, surface roughness-measuring apparatus.

The centerline average surface roughness Ra of the sand-blasted to silicon nitride substrate was measured by a needle contact-type, surface roughness-measuring apparatus. The results are shown in FIG. 6. In FIG. 6, the axis of abscissas indicates the length (30 mm) of an area measured on Iv the silicon nitride substrate surface, and the axis of ordinates indicates Ra. The origin of measurement is indicated by O, and the scale of Ra and length measured are shown on the lower left. As a result, in the silicon nitride substrate of this EXAMPLE, Ra was 0.6 μm, an area ratio of the silicon nitride grains was 81.0%, and an area ratio of the grain boundaries was 19.0%.

Figure 7A:
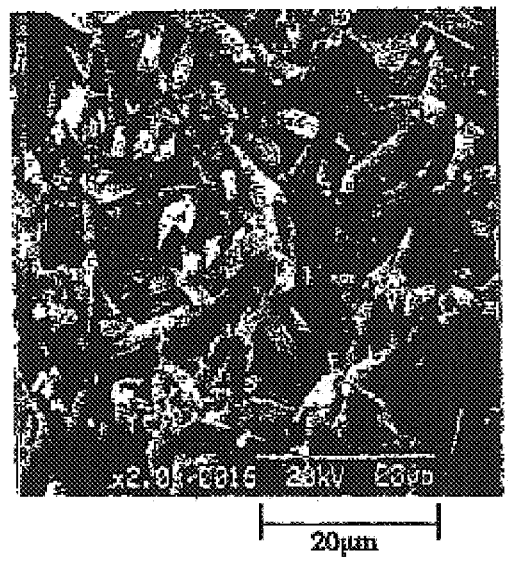
FIG. 7(a) is a scanning electron micrograph showing the surface structure of the silicon nitride substrate in EXAMPLE 4.
Figure 7B:
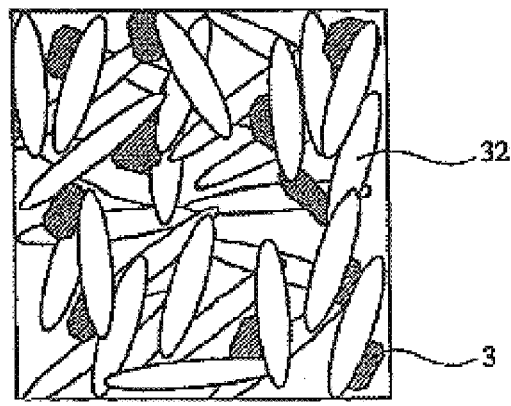
FIG. 7(b) is a schematic view of FIG. 7(a)
Figure 11:
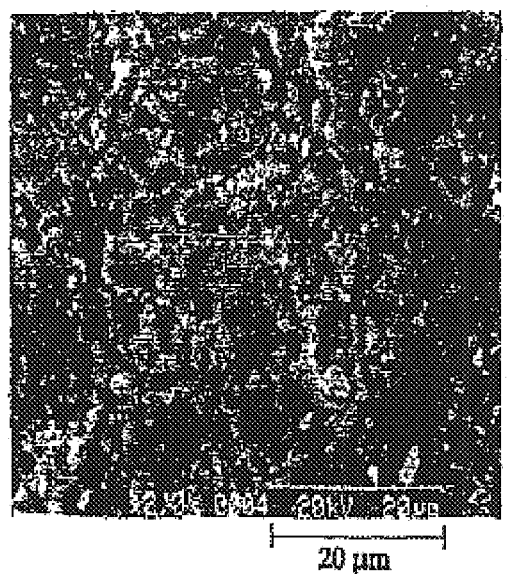
FIG. 11 is a scanning electron micrograph showing the surface structure of the silicon nitride substrate (area ratio of silicon nitride grains: 5%)

FIG. 7(a) is a scanning electron micrograph (magnitude: 2,000 times) showing a surface structure of the silicon nitride substrate, and FIG. 7(b) is a schematic view corresponding to the scanning electron micrograph of FIG. 7(a), in which 32 denotes silicon nitride grains, and 31 denotes grain boundaries. For comparison, the micrograph of FIG. 11 shows a surface structure of the silicon nitride substrate in which the area ratio of silicon nitride grains is 5%.

Figure 8A:
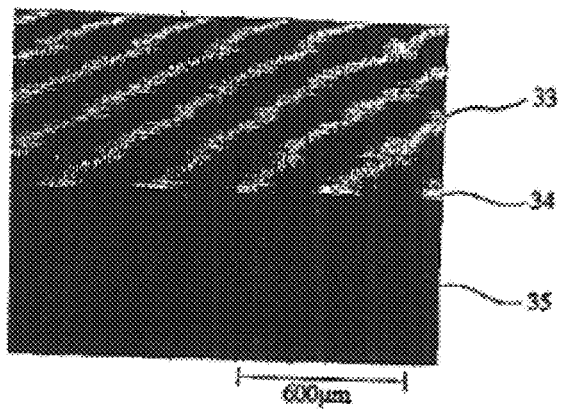
FIG. 8(a) is a scanning electron micrograph showing the cross section structure of the silicon nitride substrate in EXAMPLE 4.
Figure 8B:
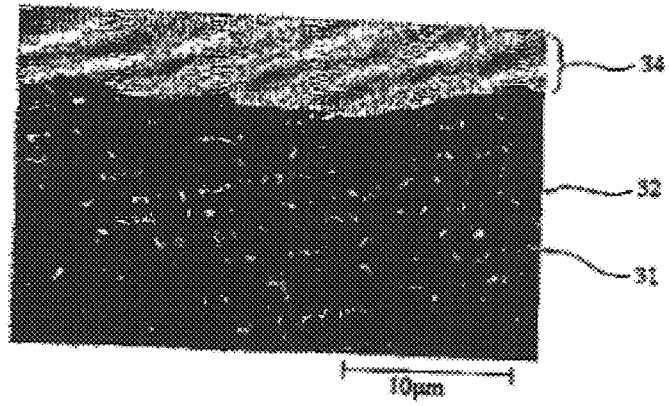
FIG. 8(b) is an enlarged photograph of FIG. 8(a)
Figure 8C:
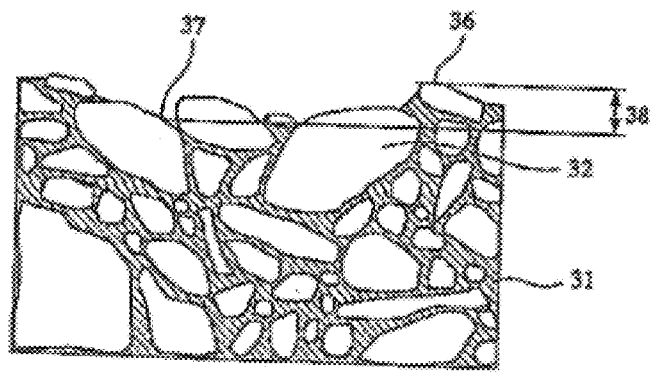
FIG. 8(c) is a schematic view of FIG. 8(b)

FIGS. 8(a) and (b) are scanning electron micrographs (magnitude: 50 times and 4,000 times, respectively) each showing a cross section structure, in which the circuit board (a Cu circuit plate 33 and a silicon nitride substrate 35 were bonded via a brazing material layer 34) of the present invention constituted by the silicon nitride substrate having Ra =0.6 μm. FIG. 8(c) is a schematic cross sectional view showing the surface texture of a silicon nitride substrate 35 before a Cu circuit plate 33 was bonded. "L" in the silicon nitride substrate 35 indicates a distance 38 between the highest peak 36 of silicon nitride grains 32 and the lowest bottom 37 of silicon nitride grains 32 or grain boundaries 31.

In the scanning electron micrographs (magnitude: 2,000 times) showing the cross-sectional structures of silicon nitride substrates (Sample Nos. 71–80) produced with appropriately changed sand blasting conditions, the distance L between the highest peak of silicon nitride grains and the lowest bottom of silicon nitride grains or grain boundaries was measured over the length of 500 μm in a field of 200 μm×500 μm. Also, a field of 200 μm×500 μm in the photograph of the cross section structure was image-analyzed to determine average area ratios of silicon nitride grains and grain boundaries.

Figure 9:
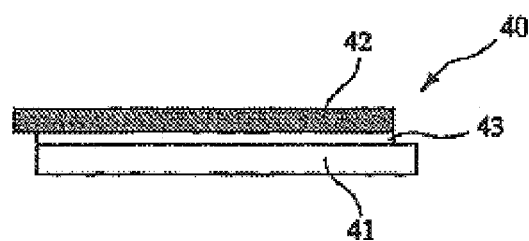
FIG. 9 is a cross-sectional view showing a sample for a peeling strength test.

To evaluate the bonding strength of the metal circuit plate to the silicon nitride substrate (Sample Nos. 71–80), a peeling strength test was carried out. With a circuit plate 42 made of copper or aluminum bonded to a silicon nitride substrate 41 such that an end portion of the circuit plate 42 extended from a side of the substrate 41 by 5 mm as shown in FIG. 9, peeling strength was a force necessary for pulling an extended end portion of the circuit plate 42 upward at 90°.

Figure 10:
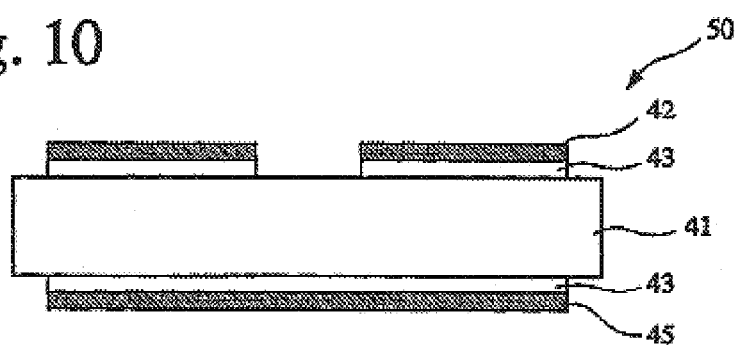
FIG. 10 is a cross-sectional view showing the circuit board according to one embodiment of the present invention.

A circuit plate 42 of copper or aluminum was bonded to a front surface of each silicon nitride substrate (Sample Nos. 71–80) 41 of 50 mm in length, 50 nm in width and 0.6 mm in thickness with a brazing material 43, and a plate 45 of copper or aluminum was bonded to a rear surface of the substrate 41 with a brazing material 43, thereby forming a circuit board 50 shown in FIG. 10.

Ra, area ratios of silicon nitride grains and grain boundaries and L of each silicon nitride substrate (Sample Nos. 71–80) are shown in Table 8. Table 8 shows peeling strength and fracture-starting site (fracture mode) when a plate of copper or aluminum was bonded to a silicon nitride substrate by blazing or directly. In the column of fracture mode in Table 8, "Cu" means that fracture occurred at a bonding metal of copper, "Al" means that fracture occurred at a bonding metal of aluminum, and "bonding interface" means that fracture occurred at a bonding interface between the substrate and the bonding metal.

COMPARATIVE EXAMPLE 3

Silicon nitride substrates and circuit boards were produced and evaluated in the same manner as in EXAMPLE 4 except for changing the sand blasting conditions. The results are shown in Table 8 on the columns of Sample Nos. 91–98.

TABLE 8

| | | Silicon Nitride Substrate | | | | | Peeling Strength Test | |
| | | Area Ratio (%) | | | | | | |
| Sample No. | Ra (μm) | Silicon Nitride Particles | Grain Boundaries | (μm) | Bonding Metal | Bonding Method | Strength (kN/m) | Broken at |
| --- | --- | --- | --- | --- | --- | --- | --- | --- |
| 71 | 5.0 | 85 | 15 | 15.0 | Cu | Blazing | 31.0 | Cu |
| 72 | 2.0 | 90 | 10 | 5.0 | Cu | Blazing | 30.5 | Cu |
| 73 | 0.8 | 90 | 10 | 1.5 | Cu | Blazing | 28.0 | Cu |
| 74 | 5.0 | 85 | 15 | 15.0 | Cu | Direct Bonding | 27.5 | Cu |
| 75 | 2.0 | 90 | 10 | 5.0 | Cu | Direct Bonding | 26.0 | Cu |
| 76 | 0.8 | 90 | 10 | 1.5 | Cu | Direct Bonding | 25.5 | Cu |
| 77 | 5.0 | 85 | 15 | 15.0 | Al | Blazing | 25.0 | Al |
| 78 | 2.0 | 90 | 10 | 5.0 | Al | Blazing | 24.0 | Al |
| 79 | 5.0 | 85 | 15 | 15.0 | Al | Direct Bonding | 22.0 | Al |
| 80 | 2.0 | 90 | 10 | 5.0 | Al | Direct Bonding | 22.2 | Al |
| 91 | 0.1 | 90 | 10 | 1.2 | Cu | Blazing | 8.5 | Bonding Interface |
| 92 | 22.0 | 90 | 10 | 38.0 | Cu | Blazing | 9.5 | Bonding Interface |
| 93 | 2.0 | 60 | 40 | 5.0 | Cu | Blazing | 5.5 | Bonding Interface |
| 94 | 0.6 | 90 | 10 | 0.8 | Cu | Blazing | 7.0 | Bonding Interface |
| 95 | 10.0 | 90 | 10 | 45.0 | Cu | Blazing | 6.5 | Bonding Interface |
| 96 | 22.0 | 90 | 10 | 2.5 | Al | Direct Bonding | 7.0 | Bonding Interface |
| 97 | 22.0 | 90 | 10 | 2.5 | Al | Blazing | 6.5 | Bonding Interface |
| 98 | 22.0 | 90 | 10 | 2.5 | Al | Direct Bonding | 6.2 | Bonding Interface |

It was confirmed from Sample Nos. 71–80 (EXAMPLE 4) in Table 8 that when silicon nitride substrates having a surface condition of a centerline average surface roughness Ra of 0.2–20 ml, an area ratio of silicon nitride grains being 70–100% in a surface layer, and the distance L between the highest peak of silicon nitride grains and the lowest bottom of silicon nitride grains or grain boundaries being 1–40 am, were used, and when plates of copper or aluminum were bonded to the silicon nitride substrates, any of the resultant circuit boards had as high peeling strength as 22.0 kN/m or more, causing no fracture in bonded portions.

The following was found from Sample Nos. 91–98 of COMPARATIVE EXAMPLE 3 in Table 8:
(1) Sample No. 91 had a centerline average surface roughness Ra of less than 0.2 μm and as low peeling strength as 8.5 kN/m, so that fracture occurred from a bonding interface.
(2) Sample No. 92 had a centerline average surface roughness Ra of more than 20 μm and as low peeling strength as 9.5 kN/m, so that fracture occurred from a bonding interface.
(3) Sample No. 93 had an area ratio of silicon nitride grains of less than 70%, an area ratio of grain boundaries of more than 30%, and as low peeling strength as 5.5 kN/m, so that fracture occurred from a bonding interface.
(4) Sample No. 94 had a surface peak-bottom distance L of less than 1 μm and as low peeling strength as 7.0 kN/m, so that fracture occurred from a bonding interface.
(5) Sample No. 95 had a surface peak-bottom distance L of 45 μm and peeling strength reduced to 6.5 kN/m, so that fracture occurred from a bonding interface.
(6) Sample No. 96 was the same as Sample No. 92 except for changing the bonding method from blazing to direct bonding, and had as low peeling strength as 7.0 kN/m, so that fracture occurred from a bonding interface.
(7) Sample No. 97 was the same as Sample No. 92 except for changing the metal circuit plate from a copper plate to an aluminum plate, and had as low peeling strength as 6.5 kN/m, so that fracture occurred from a bonding interface.
(8) Sample No. 98 was the same as Sample No. 97 except for changing the bonding method from blazing to direct bonding, and had as low peeling strength as 6.2 kN/m, so that fracture occurred from a bonding interface.

EXAMPLE 5

A silicon nitride substrate 41 of 50 mm in length, 50 mm in width and 0.6 mm in thickness was produced under the same conditions as in EXAMPLE 4. The resultant silicon nitride substrate 41 had Ra of 5 μm, an area ratio of silicon nitride grains of 85%, an area ratio of grain boundaries of 15%, and a surface peak-bottom distance L of 5 μm. A copper circuit plate 42 was bonded to a front surface of the silicon nitride substrate 41 with a brazing material 43, and a copper circuit plate 45 was bonded to a rear surface of the substrate 41 with a brazing material 43, thereby forming a circuit board 50 shown in FIG. 10.

A three-point bending strength test and a thermal cycle resistance test were carried out with respect to the circuit board 50. As a result, the bending strength was as high as 600 MPa or more, and there was no cracking due to fastening of the circuit board 50 at the mounting step and thermal stress at the soldering step. The production yield of a semiconductor apparatus (not shown) to which the circuit board 50 was mounted was drastically improved.

As a thermal cycle resistance test, a thermal cycle comprising cooling at −40° C. for 30 minutes, keeping at room temperature for 10 minutes and heating at 125° C. for 30 minutes was repeated to count the number of cycles until the substrate 41 was cracked. As a result, there were no cracking in the sintered silicon nitride substrate 41 and no peeling of the copper circuit plates 42, 45 even after 1,000 cycles, confirming that it had excellent durability and reliability. Also, even after 1,000 cycles, there was no decrease in breakdown voltage in the circuit board 50.

As a result of examining 1,000 circuit boards 50 with respect to a percentage of defected products by the above thermal cycle resistance test, there were no cracking in the silicon nitride substrates 41 and no peeling of the copper circuit plates 42, 45 in any circuit boards 50, confirming that they had excellent thermal shock resistance and thermal fatigue resistance.

EXAMPLE 6

Added to 10 weight % of the first silicon nitride powder having a β-particle ratio of 30% or more, which was produced in the same manner as in EXAMPLE 1, and 86 weight % of α-silicon nitride powder (average particle size: 0.2–3.0 μm) were 3 weight % of MgO and 1 weight % of to $Y_2O_3$ as sintering aids per 100 parts by weight of the total amount of the two silicon nitride powders, to form a mixed powder. The resultant mixed powder was charged into a resin ball-milling pot filled with a solution of a 2-weight-% amine dispersant in toluene/butanol together with silicon nitride balls as a pulverization medium, and mixed for 48 hours. 12.5 parts by weight of an organic binder and 4.2 parts by weight of a plasticizer (dimethyl phthalate) were added to 83.3 parts by weight of the mixed powder in the pot and mixed for 48 hours to form a slurry. The production conditions of the first silicon nitride powder are shown in Table 9, and the properties of the resultant first silicon nitride powder are shown in Table 10.

This slurry was cast to green sheets of 0.5 mm and 0.9 mm, respectively, in thickness by a doctor blade method. By heating each green sheet at 400–600° C. for 2–5 hours in the air, the organic binder was removed. The degreased green bodies were sintered at 1850° C. and 0.9 MPa (9 atm) for 5 hours in a nitrogen atmosphere, and then heat-treated at 1,900° C. for 24 hours in the same nitrogen atmosphere to form sintered silicon nitride substrates of 0.4 mm and 0.72 mm, respectively, in thickness. These sintered silicon nitride substrates had a relative density of 99.8%, a thermal conductivity of 110 W/mK, and a three-point bending strength of 700 MPa.

The 0.4-mm-thick, sintered silicon nitride substrate was used without removing an as-sintered surface layer. The 0.7-mm-thick, sintered silicon nitride substrate was ground with a diamond grinder on both surfaces. With varied levels of grinding, various insulating silicon nitride substrates having different surface roughness were obtained.

Figure 12:
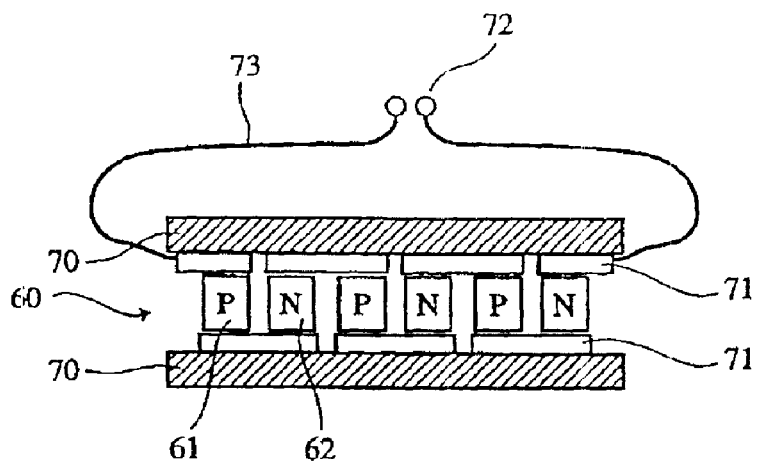
FIG. 12 is a cross-sectional view showing the thermoelectric semiconductor module according to one embodiment of the present invention.
Figure 13:
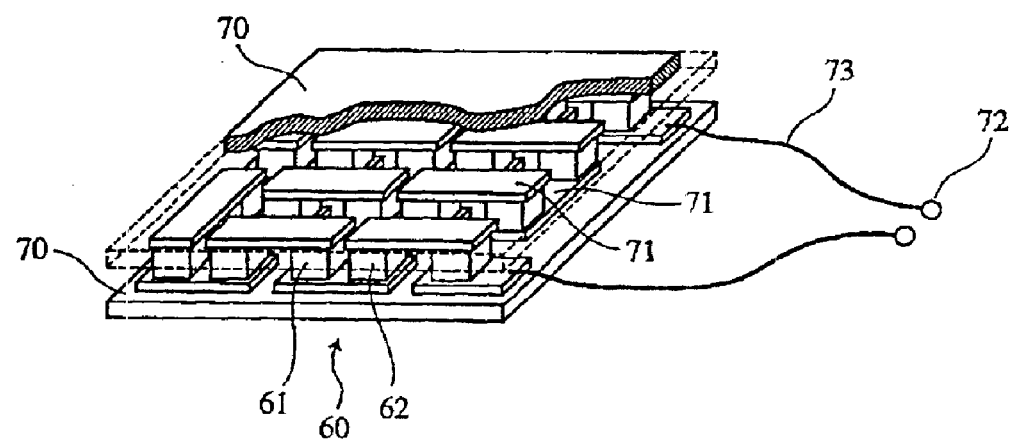
FIG. 13 is a schematic view showing a thermoelectric module.

An Ni plating layer having a thickness of 0.5 μm, a Cu plating layer having a thickness of 36 μm, an Ni plating layer having a thickness of 3 μm, and an Au plating layer having a thickness of 0.5 μm were formed in this order in electrode-forming regions of predetermined shapes on one side of the resultant insulating silicon nitride substrate, to form electrodes 71. Soldered with Sn—Sb to these electrodes 71 were 10 sets of p-type and n-type thermoelectric semiconductor elements each having a length of 2 mm, and lead wires 73 to produce a thermoelectric module shown in FIG. 12.

DC current voltage was applied to the terminals of this thermoelectric semiconductor element. The polarity of voltage applied to the terminals was changed at a time when two insulating silicon nitride substrates 2 reached a temperature difference of 70° C., to interchange a heat-generating side and a heat-absorbing side, and electric current was supplied until the temperature difference similarly reached 70° C. After a cooling/heating cycle test comprising these operations was repeated 2,000 times, peeling was examined in bonded portions between the electrodes 71 and the insulating silicon nitride substrate 70. The results are shown in Table 11.

TABLE 9

| | Starting Silicon Nitride Powder | | | Heat Treatment Conditions | | |
|---|---|---|---|---|---|---|
| Sample No. | Oxygen (wt. %) | Specific Surface Area (m²/g) | Av. Particle Size (μm) | Pressure (MPa) | Temp. (° C.) | Time (hr) |
| 100* | 0.5 | 10.0 | 0.7 | 0.9 | 1950 | 10 |
| 110 | 0.5 | 10.0 | 0.7 | 0.9 | 1950 | 10 |
| 111 | 0.4 | 10.0 | 0.7 | 0.9 | 1950 | 10 |
| 112 | 0.4 | 10.0 | 0.7 | 0.9 | 1950 | 10 |
| 113 | 0.4 | 10.0 | 0.7 | 0.9 | 1950 | 10 |
| 114 | 0.5 | 10.0 | 0.7 | 0.9 | 1950 | 10 |
| 101* | 0.5 | 10.0 | 0.7 | 0.9 | 1950 | 10 |
| 102* | 0.5 | 10.0 | 0.7 | 0.9 | 1950 | 10 |
| 103* | 0.5 | 10.0 | 0.7 | 0.9 | 1950 | 10 |

Note: *Outside the scope of the present invention (unmarked samples are within the scope of the present invention).

TABLE 10

| | First Silicon Nitride Powder | | | | | |
|---|---|---|---|---|---|---|
| | β | Impurities | | | Average Particle | |
| Sample No. | Ratio (%) | O (wt. %) | Fe (ppm) | Al (ppm) | Size (μm) | Aspect Ratio |
| 100* | 100 | 0.3 | 30 | 50 | 2 | 5 |
| 110 | 100 | 0.3 | 30 | 50 | 2 | 5 |
| 111 | 100 | 0.3 | 30 | 50 | 2 | 5 |
| 112 | 100 | 0.2 | 30 | 50 | 2 | 5 |
| 113 | 100 | 0.2 | 30 | 50 | 2 | 5 |
| 114 | 100 | 0.3 | 30 | 50 | 2 | 5 |
| 101* | 100 | 0.3 | 30 | 50 | 2 | 5 |
| 102* | 100 | 0.3 | 30 | 50 | 2 | 5 |
| 103* | 100 | 0.3 | 30 | 50 | 2 | 5 |

Note: *Outside the scope of the present invention (unmarked samples are within the scope of the present invention).

TABLE 11

| | Surface Texture of Insulating Silicon Nitride Substrate | | Results of Cooling/Heating Cycle Test | |
|---|---|---|---|---|
| Sample No. | Grinding | Centerline Average Surface Roughness Ra | Cracking in Insulating Silicon Nitride Substrate | Peeling at Bonding Interface |
| 100* | Yes | 0.006 | No | Yes |
| 110 | Yes | 0.01 | No | No |
| 111 | Yes | 0.05 | No | No |
| 112 | Yes | 0.11 | No | No |
| 113 | Yes | 0.32 | No | No |
| 114 | Yes | 0.58 | No | No |
| 101* | Yes | 0.9 | No | Yes |
| 102* | Yes | 1.8 | No | Yes |
| 103* | No (as-sintered surface layer) | 65 | Yes | Yes |

Note: *Outside the scope of the present invention (unmarked samples are within the scope of the present invention).

As is clear from Table 11, in each thermoelectric module (Sample Nos. 110–114) of the present invention, an as-sintered surface layer was removed from the insulating silicon nitride substrate 70 by grinding, so that the centerline average surface roughness Ra of the substrate 70 was in a range of 0.01–0.60 μm. Therefore, there were no cracking and peeling in the interfaces between the electrodes 71 and the substrate 70. On the other hand, in Sample No. 100 (outside the scope of the present invention), the centerline average surface roughness Ra was less than 0.01 μm, and there was peeling in the bonding interfaces between the electrodes 71 and the substrate. In Sample Nos. 101 and 102 (outside the scope of the present invention), the centerline average surface roughness Ra was more than 0.6 μm, and there was also peeling in the bonding interfaces between the electrodes 71 and the substrate. In Sample No. 103 (outside the scope of the present invention), in which the silicon nitride substrate was as sintered, there were pores and roughness, and thus a large centerline average surface roughness Ra on the surface. Accordingly, cracking occurred from the insulating silicon nitride substrate, and the propagation of cracking led to peeling in the bonding interfaces between the electrodes 71 and the substrate.

In the above EXAMPLES, as-sintered surface layers were removed by grinding from the sintered silicon nitride substrates in surface regions to which the electrodes 71 were bonded, thereby achieving a centerline average roughness Ra of 0.01–0.6 μm on the surfaces from which as-sintered surface layers were removed. Thus, by grinding the surfaces to which the electrodes 71 are bonded, the thickness of the insulating silicon nitride substrate 70 can be controlled with high accuracy, suitable for products such as thermoelectric modules requiring strict dimension accuracy. In the present invention, of course, grinding may be conducted in at least regions to which the electrodes 71 are bonded.

As described above in detail, because the silicon nitride sintered body of the present invention has high strength and toughness as inherent properties and high thermal conductivity, it is excellent in thermal shock resistance and thermal cycle resistance. Therefore, when the silicon nitride sintered body of the present invention is used as a substrate for semiconductor elements, no cracking occurs even by repeated thermal cycles by the operation of semiconductor elements.

In addition, because the sintered silicon nitride substrate of the present invention has a surface texture suitable for bonding to a metal circuit plate of copper, aluminum, etc., the bonding strength of the metal circuit plate to the silicon nitride substrate is extremely high. Accordingly, in the circuit board of the present invention in which the metal circuit plate is bonded to the sintered silicon nitride substrate, neither cracking in the substrate and nor peeling of the metal circuit plate occur, even when the substrate is repeatedly subjected to thermal cycles by the operation of semiconductor elements.

The thermoelectric element module of the present invention is excellent in resistance to thermal cycles, because an as-sintered surface layer is removed from the insulating silicon nitride substrate, and because the surface roughness of the insulating silicon nitride substrate is adjusted to an appropriate range. Therefore, the thermoelectric module of the present invention has long life and thus high reliability.

What is claimed is:

1. A silicon nitride sintered body comprising Mg and at least one rare earth element selected from the group consisting of La, Y, Gd and Yb, the total oxide-converted content of said Mg and at least one rare earth element selected from the group consisting of La, Y, Gd and Yb being 0.6–7 weight %, with Mg converted to MgO and rare earth elements converted to rare earth oxides y in which nano-size, fine particles at least containing Mg, at least one rare earth element selected from the group consisting of La, Y, Gd and Yb, and O and having an average particle size of 100 nm or less are observed in silicon nitride grains, in a transmission electron micrograph having a magnitude of 10,000 times or more.

2. The silicon nitride sintered body according to claim 1, wherein each of said nano-size, fine particles is constituted by a core and a peripheral portion having different compositions.

3. The silicon nitride sintered body according to claim 1, wherein said nano-size, fine particles are amorphous.

4. A silicon nitride substrate constituted by a silicon nitride sintered body comprising Mg and at least one rare earth element selected from the group consisting of La, Y, Gd and Yb, the total oxide-converted content of said elements Mg and at least one rare earth element selected from the group consisting of La, Y, Gd and Yb being 0.6–7 weight %, with Mg converted to MgO and rare earth elements converted to rare earth oxides $RE_xO_y$, and a weight ratio expressed by $MgO/RE_xO_y$ of 3–70, wherein said substrate has a surface texture having a centerline average surface roughness Ra of 0.2–20 μM and consists essentially of silicon nitride grains and grain boundaries, an area ratio of said silicon nitride grains being 70–100% in a substrate surface, assuming that the total area ratio of said silicon nitride grains and said grain boundaries is 100%.

5. The silicon nitride substrate according to claim 4, wherein the distance L between the highest peak of silicon nitride grains exposed on a surface and the lowest bottom of silicon nitride grains or grain boundaries is 1–40 μm.

6. A silicon nitride substrate constituted by a silicon nitride sintered body comprising Mg and at least one rare earth element selected from the group consisting of La, Y, Gd and Yb, the total oxide-converted content of said Mg and at least one rare earth element selected from the group consisting of La, Y, Gd and Yb being 0.6–7 weight %, with Mg converted to MgO and rare earth elements converted to rare earth oxides $RE_xO_y$, in which nano-size, fine particles at least containing Mg, at least one rare earth element selected from the group consisting of La, Y, Gd and Yb, and O and having an average particle size of 100 nm or less are observed in silicon nitride grains, in a transmission electron micrograph having a magnitude of 10,000 times or more, wherein said substrate has a surface texture having a centerline average surface roughness Ra of 0.2–20 μm and consists essentially of silicon nitride grains and grain boundaries, an area ratio of said silicon nitride grains being 70–100% in a substrate surface, assuming that the total area ratio of said silicon nitride grains and said grain boundaries is 100%.

7. The silicon nitride substrate according to claim 6, wherein the distance L between the highest peak of silicon nitride grains exposed on a surface and the lowest bottom of silicon nitride grains or grain boundaries is 1–40 μm.

\* \* \* \* \*